United States Patent [19]
Nilssen

[11] Patent Number: 5,481,160
[45] Date of Patent: Jan. 2, 1996

[54] ELECTRONIC BALLAST WITH FET BRIDGE INVERTER

[76] Inventor: Ole K. Nilssen, 408 Caesar Dr., Barrington, Ill. 60010

[21] Appl. No.: 330,605

[22] Filed: Oct. 28, 1994

Related U.S. Application Data

[63] Continuation of Ser. No. 20,696, Feb. 22, 1993, abandoned, which is a continuation-in-part of Ser. No. 840,528, Feb. 25, 1992, Pat. No. 5,189,342, which is a continuation of Ser. No. 646,497, Jan. 28, 1991, abandoned, which is a continuation of Ser. No. 107,795, Oct. 13, 1987, abandoned, which is a continuation-in-part of Ser. No. 658,423, Oct. 5, 1984, abandoned, which is a continuation-in-part of Ser. No. 555,426, Nov. 23, 1983, abandoned, which is a continuation of Ser. No. 178,107, Aug. 14, 1980, abandoned, which is a continuation-in-part of Ser. No. 973,741, Dec. 28, 1978, abandoned, which is a continuation-in-part of Ser. No. 890,586, Mar. 20, 1978, Pat. No. 4,184,128.

[51] Int. Cl.$^6$ .................... H05B 41/29; H05B 41/36
[52] U.S. Cl. .................... 315/209 R; 315/210; 315/224; 315/226; 315/307; 315/DIG. 5
[58] Field of Search .................... 315/209 R, 210, 315/224, 226, 205, 228, 239, 244, 254, 258, 276, 283, 307, 312, DIG. 5

[56] References Cited

U.S. PATENT DOCUMENTS 4,692,667  9/1987  Nilssen .................... 315/209 R

*Primary Examiner*—David Mis

[57] ABSTRACT

Controlled DC supply voltage is provided to a self-oscillating FET bridge inverter ballast from a pre-converter and by way of an inductor having two separate windings on a common magnetic core—with one winding being positioned in each leg of the DC supply. The inverter is loaded by way of a parallel-tuned L-C circuit connected across the bridge inverter's output, thereby providing a special AC output voltage thereat. This special AC output voltage is characterized in that it exhibits an unusually high rate of voltage change at its cross-over points but otherwise has a substantially sinusoidal waveshape. An instant-start fluorescent lamp is connected via a current-limiting capacitor across the bridge inverter's output. The magnitude of the DC supply voltage is so chosen as to cause the magnitude of the AC output voltage to be such as to effectuate proper instant-starting of the fluorescent lamp. Because the AC output voltage is balanced with respect to ground, U.L. requirements are met without the need for an isolation transformer. Each of the four FET's is driven by providing a sinusoidal AC voltage directly from a positive feedback winding on the tank-inductor of the L-C circuit.

50 Claims, 7 Drawing Sheets

_5,481,160_

ELECTRONIC BALLAST WITH FET BRIDGE INVERTER

RELATED APPLICATIONS

This application is a continuation of Ser. No. 08/020,696 filed 02/22/93, now abandoned; which is a continuation-in-part of Ser. No. 07/840,528 filed 02/25/92, now U.S. Pat. No. 5,189,342; which is a continuation of Ser. No. 07/646,497 filed 01/28/91, now abandoned; which is a continuation of Ser. No. 07/107,795 filed 10/13/87, now abandoned; which is a continuation-in-part of Ser. No. 06/658,423 filed 10/05/84, now abandoned; which is a continuation-in-part of Ser. No. 06/555,426 filed 11/23/83, now abandoned; which is a continuation of Ser. No. 06/178,107 filed 08/14/80, now abandoned; which is a continuation-in-part of Ser. No. 05/973,741 filed 12/28/78, now abandoned; which is a continuation-in-part of Ser. No. 05/890,586 filed 03/20/78, now U.S. Pat. No. 4,184,128.

FIELD OF THE INVENTION

Instant invention relates to a self-oscillating parallel-tuned resonant transistor inverter ballast, particularly of a kind that includes a full-bridge inverter with FET's.

SUMMARY OF THE INVENTION

1. Objects of the Invention

An object of the present invention is that of providing cost-effective electronic ballasts for gas discharge lamps.

This, as well as other objects and advantages of the present invention will become apparent from the following description.

2. Brief Description

In its presently preferred embodiment, the invention is represented by a full-bridge inverter having four field-effect-type switching transistors ("FET's"), with each FET being controlled by positive feedback of a sinusoidal voltage obtained directly from a winding on the tank-inductor of a resonant L-C circuit connected across the bridge inverter's output terminals. The bridge inverter is powered with a controlled DC supply voltage obtained via a preconverter connected with an ordinary electric utility power line by way of a bridge rectifier.

The controlled DC supply voltage is provided to the bridge inverter via an inductor having two separate windings on a common magnetic core—with one winding being positioned in each leg of the DC supply. The inverter is loaded by way of a parallel-tuned L-C circuit connected across the bridge inverter's output, thereby providing a sinusoidal AC output voltage thereacross. A series-combination of an instant-start fluorescent lamp and a current-limiting capacitor is connected directly across the bridge inverter's output terminals.

The magnitude of the DC supply voltage is so chosen as to cause the magnitude of the AC output voltage to be such as to effectuate proper instant-starting of the fluorescent lamp. Thus, as an example, for a so-called F-32/T-8 Octron instant-start fluorescent lamp, the magnitude of the inverter output voltage should be 500 Volt RMS; which, with the parallel-tuned bridge inverter, requires a DC supply voltage of about 320 Volt.

Because the AC output voltage is balanced with respect to ground, the U.L. so-called pin-test requirement is met without the need for an output isolation transformer.

Each of the four FET's is driven by providing to its gate input an AC gate drive voltage derived directly from a positive feedback winding on the tank-inductor of the L-C circuit; which AC gate drive voltage will therefore be of sinusoidal waveform.

By delivering voltage and current to the lamp-capacitor series-combination directly from the inverter's output terminals (i.e., without going through transformer action), only a minimum amount of Volt-Amperes need be handled; which therefore leads to a particularly high efficiency. More particularly and by way of example, since the exemplary lamp's ignition voltage is Volt RMS and its required operating current is about 0.2 Ampere RMS, and since the lamp's operating voltage is only about 150 Volt RMS, it will be understood that the Volt-Ampere product necessary to supply to the lamp-capacitor series-combination is about 100 Volt-Ampere. If these 100 Volt-Amperes were to have passed through an isolation transformer, the primary winding and the secondary winding of that transformer would each have had to handle 100 Volt-Amperes; which, with an more-or-less ordinary isolation transformer, would result in substantial losses. For instance, even with a transformer efficiency as high as 95%, losses would amount to 5 Watt; which, compared with the 30 Watt power drawn by the lamp, is very substantial indeed.

Thus, inter alia, instant invention is aimed at minimizing the handling of Volt-Amperes in the circuitry of the ballast.

BRIEF DESCRIPTION OF THE DRAWINGS

FIG. 4b shows various current or voltage waveforms mainly associated with the Pre-Converter Circuit of FIG. 3a.

DESCRIPTION OF THE INITIAL EMBODIMENT

Details of Construction of Initial Embodiment

Figure 1:
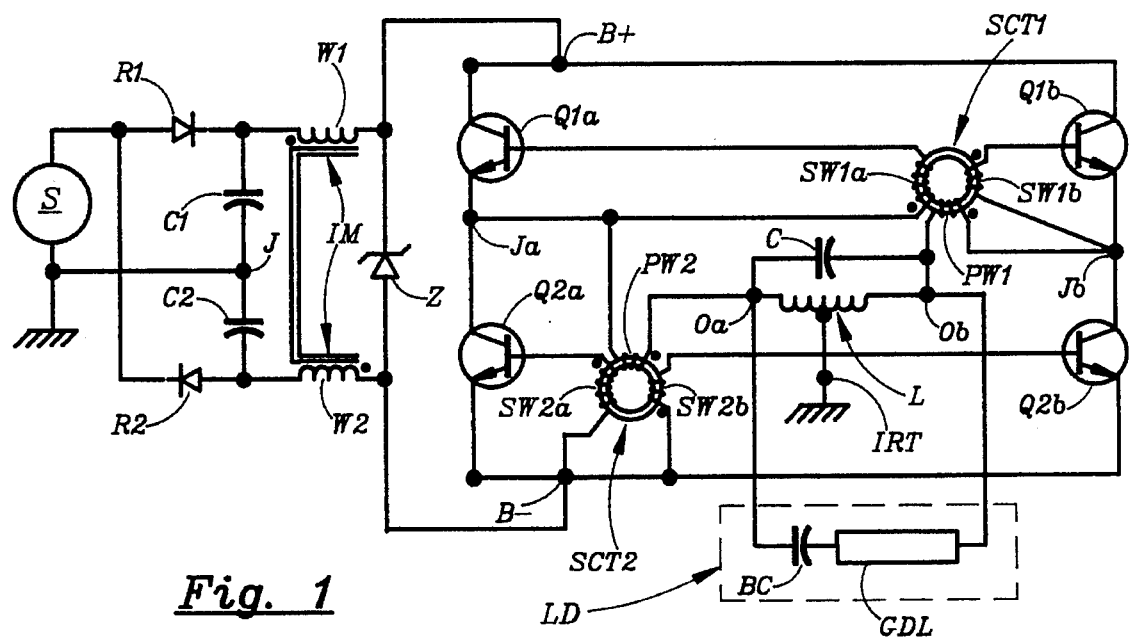
FIG. 1 schematically illustrates an initial embodiment of the invention.

FIG. 1 shows an AC power supply S, which in reality is an ordinary 120 Volt/60 Hz electric utility power line.

One terminal of power supply S is grounded and also directly connected to a junction J between two energy-storing capacitors C1 and C2. The other terminal of power supply S is connected to the anode of a rectifier R1 and to the cathode of a rectifier R2. Rectifier R1 has its cathode connected to one terminal of C1—the other terminal of C1 being connected to junction J. Rectifier R2 has its anode connected to one terminal of C2—the other terminal of C2 being connected to junction J.

An inductor means IM has two equal but separate windings W1 and W2: W1 is connected between the cathode of rectifier R1 and a junction B+ between the collectors of two transistors Q1a and Q1b; W2 is connected between the anode of R2 and a junction B− between the emitters of two transistors Q2a and Q2b.

A Zener diode Z is connected between junction B+ and junction B−.

Transistor Q1a is connected with its emitter to a junction Ja, as is also the collector of transistor Q2a. Transistor Q1b is connected with its emitter to a junction Jb, as is also the collector of transistor Q2b.

A center-tapped inductor L is connected between inverter output terminals Oa and Ob. Connected in parallel with L is a capacitor C. The center-tap on inductor L, which is referred-to as inverter reference terminal IRT, is grounded.

Primary winding PW1 of saturable current-transformer SCT1 is connected between junction Jb and output terminal Ob. Primary winding PW2 of saturable current-transformer SCT2 is connected between junction Ja and output terminal Oa.

One secondary winding SW1a of transformer SCT1 is connected between the base and the emitter of transistor Q1a; another secondary winding SW1b of transformer SCT1 is connected between the base and the emitter of transistor Q1b.

One secondary winding SW2a of transformer SCT2 is connected between the base and the emitter of transistor Q2a; another secondary winding SW2b of transformer SCT2 is connected between the base and the emitter of transistor Q2b.

A series-combination of a ballasting capacitor CB and a gas discharge lamp GDL constitutes a load LD; which load is connected across output terminals Oa and Ob.

Details of Operation of Initial Embodiment

The operation of the full-bridge inverter circuit of FIG. 1 may be explained as follows.

Source S provides 120 Volt/60 Hz voltage to the voltage-doubling and rectifying/filtering circuit consisting of R1, R2, C1 and C2. A substantially constant DC voltage of about 320 Volt magnitude then results at the output of this circuit, with the positive side of this DC voltage being present at the cathode of R1 and the negative side being present at the anode of R2.

This substantially constant-magnitude DC voltage is applied by way of inductor means IM and its two windings W1 and W2, poled as indicated, to the DC power input terminals B+ and B− of the full-bridge inverter circuit comprising transistors Q1a, Q1b, Q2a and Q2b.

This inverter circuit is made to self-oscillate by way of positive current feedback provided by saturable current-transformers SCT1 and SCT2, poled as indicated. Thus, the magnitude of the current provided to any given transistor's base-emitter junction is proportional to the magnitude of the current flowing between output terminals Oa and Ob.

The frequency of inverter oscillation is determined by a combination of the saturation characteristics of the saturable current-transformers and the natural resonance frequency of the parallel L-C circuit (as combined with any tuning effects caused by the load connected thereacross).

The saturation characteristics of the saturable current-transformers are substantially identical to one another and so chosen that, when there is no load connected across output terminals Oa and Ob, the waveform of the output voltage is as indicated in FIG. 2a; which waveform is made up of sinusoidal half-waves of voltage, indicated by HW1 and HW2, interconnected with periods of zero-magnitude voltage, indicated by ZM1 and ZM2. This waveform is achieved by making the time-length of the saturation-time required for the saturable current-transformers to reach saturation longer than the time-length of one of the sinusoidal half-waves of voltage. The degree to which the time-length of the saturation-time is longer than the time-length of one of the sinusoidal half-waves of voltage corresponds to the time-length of the periods of zero-magnitude voltage.

In FIG. 2a, each of the sinusoidal half-waves of voltage represents the natural interaction between L and C as fed from a substantially constant current source.

In combination, the two separate but equal windings W1 and W2 of inductor means IM provide for a total inductance that is large enough so that the current flowing through the two windings and into the inverter remains substantially constant during a complete time-period of one cycle of the inverter's oscillation.

That is, the DC current flowing into the B+ junction and out of the B− junction is substantially constant during the interval between point X and point Y in FIG. 2a. Thus, whenever the L-C parallel circuit is connected between B+ and B−—which it is during the complete time-length of each of the sinusoidal half-waves of voltage—it is indeed fed from a substantially constant current source.

When a load impedance having a net component of capacitive reactance (such as does LD) is connected across the inverter's output terminals Oa and Ob, capacitive reactance is in effect added to the L-C parallel circuit; which results in the time-lengthening of the sinusoidal half-waves of voltage—as indicated by FIG. 2b. The more capacitance added this way, the more time-lengthening results.

On the other hand, when a load impedance having a net component of inductive reactance is connected between Oa and Ob, the result would be a time-shortening of the sinusoidal half-waves of voltage.

By having two different load impedances connected between Oa and Ob, and by having these two load impedances be of conjugate nature, there will be no net effect on the length of the period of the sinusoidal half-waves. For instance, by having another gas discharge lamp like GDL connected in series with an inductor having a reactance of the same absolute magnitude as that of CB, and by connecting this series-combination in parallel with load LD, the total net load impedance would be resistive and would cause no net shortening or lengthening of the sinusoidal half-waves of voltage.

By making the time-length of the saturation-time of the saturable current-transformers substantially equal to the time-length of one of the sinusoidal half-waves of voltage, the resulting output voltage will be as illustrated in FIG. 2c; which indicates that the net inversion frequency will now be the same as the natural resonance frequency of the L-C parallel circuit (as combined with whatever load impedance might be connected between Oa and Ob).

By making the time-length of the saturation-time of the saturable current-transformers shorter than the time-length of one of the sinusoidal half-waves of voltage, the resulting output voltage will be as illustrated in FIG. 2d; which indicates that the net inversion frequency will now be higher then the natural resonance frequency of the L-C circuit (as combined with whatever load impedance might be connected between Oa and Ob).

Additional Comments re Initial Embodiment (a) As long as the time-length of the saturation-time of the saturable current-transformers remains equal to or longer than the time-length of one of the sinusoidal half-waves of voltage, the net inversion frequency will not be affected by the addition or removal of a load impedance, such as LD of FIG. 1, regardless of the magnitude of the net reactive impedance thereby added to or subtracted from the L-C parallel circuit.

(b) The magnitude of the Zener voltage of Zener diode Z is chosen such as to be somewhat higher than the maximum magnitude of the peak voltage of the sinusoidal half-waves of voltage present across the inverter's output terminals Oa and Ob. That way, the Zener diode will not interfere with normal operation of the inverter; yet, it will prevent the magnitude of the peak voltages of the sinusoidal half-waves from substantially exceeding the normally occurring maximum magnitudes. Without the Zener diode, for various transient reasons (such as due to the sudden removal of a load) the magnitude of the peak voltages of the sinusoidal half-waves would occasionally become substantially larger than the normally occurring maximum magnitudes; and that would either cause transistor destruction, or it would necessitate the use of very special transistors of exceptionally high voltage capabilities.

(c) Inductor L is center-tapped; which, in effect, provides for a center-tap between the inverter's output terminals Oa and Ob. This center-tap is grounded. In many applications, particularly in the case of fluorescent lamp ballasts, it is very valuable to have the output referenced to ground.

(d) Inductor L may be integrally combined with a center-tapped auto-transformer; in which case the output voltage can readily be provided at any desired magnitude, while maintaining a ground-connected center-tap.

(e) Inductor means IM may consist of two entirely independent inductors—with one inductor located in each leg of the power supply. In fact, it is even acceptable under some circumstances to use but a single inductor in just one leg of the power supply; in which case, however, it would not be possible to connect the output's center-tap with the power supply's center-tap.

(f) It is not necessary to power the inverter of FIG. 1 from a voltage doubler. However, doing so provides for the advantage in many situations of being able to reference the center-tap of the inverter's output with one of the legs of the power line.

(g) The inverter of FIG. 1 must be triggered into oscillation. This triggering may be accomplished by way of providing a special trigger winding on each of the feedback current-transformers, and then to discharge a capacitor through these trigger windings. This may be done automatically with an arrangement consisting of a capacitor-resistor combination connected between B+ and B−, and a Diac for discharging the capacitor through the trigger windings.

(h) Finally, it is noted that the average absolute magnitude of the AC voltage appearing between inverter output terminals Oa and Ob must be substantially equal to the magnitude of the DC voltage provided from across the two series-connected energy-storing capacitors C1 and C2.

Or, stated differently, in the circuit of FIG. 1, if the inverter's AC output voltage as provided between terminals Oa and Ob were to be rectified in a full-wave rectifier, the average magnitude of the DC voltage obtained from this full-wave rectifier would have to be-substantially equal to the magnitude of the DC voltage supplied from the DC output of the rectifier/filter combination consisting of R1, R2, C1 and C2.

This relationship would have to exist substantially regardless of the nature of the load connected between the inverter's output terminals.

(i) Although the full-bridge inverter circuit of FIG. 1 may be designed to invert at any one of a wide range of frequencies, in the preferred embodiment the inversion frequency is approximately 30 kHz. Thus, the time-length of the interval between point X and point Y of FIG. 2a is about 33 micro-seconds.

Figure 2:
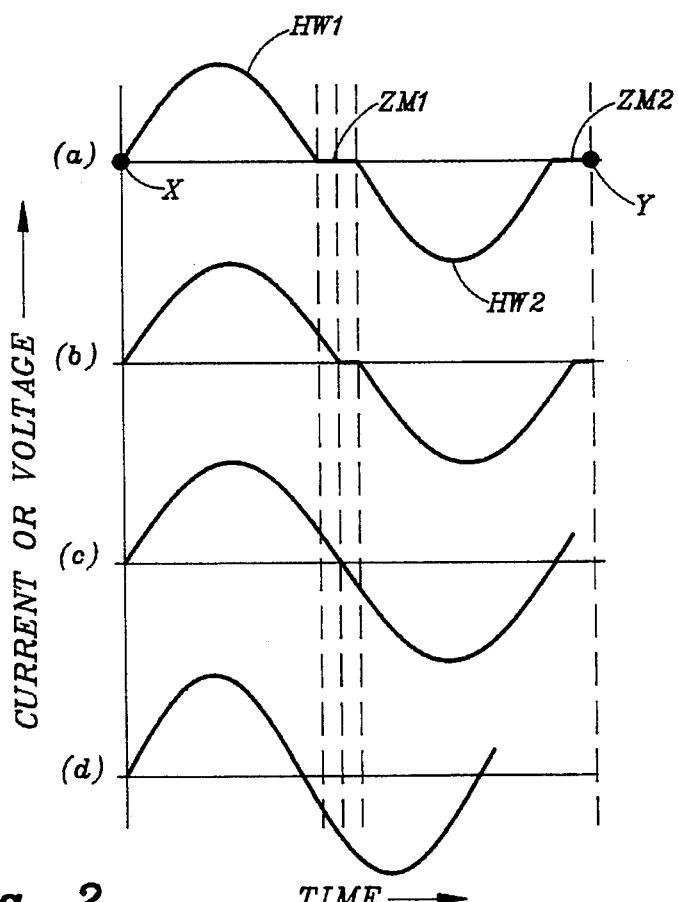
FIG. 2 shows various current or voltage waveforms associated with the embodiment if FIG. 1.

(j) The waveforms of FIG. 2 depict the voltage present between output terminals Oa and Ob under different operating conditions. Of course, the voltage present between Oa and inverter reference terminal IRT is equal to half the voltage present between terminals Oa and Ob.

(k) Due to the balanced nature of the inverter and its DC power supply, with reference to any one of the terminals of filter capacitors C1 and C2, any high frequency voltage present at inverter reference terminal IRT—even if it were not connected with ground—would have negligible magnitude.

(1) The primary windings of saturable current transformers SCT1 and SCT2 have fewer turns than do the secondary windings. Typically, the transistors operate with a 1:4 primary-to-secondary turns ratio; which corresponds to a forced current gain of four. At that turns ratio, the magnitude of the voltage developing across the primary winding of each of the saturable current transformers is only one fourth of the magnitude of the base-emitter voltage; which, of course, is only about 0.8 Volt.

In other words, the magnitude of the voltage developing across the primary winding of each staturable transformer is only about 0.2 Volt; which, of course, represents a magnitude that is totally negligible in comparison with the magnitude of the voltage developing between output terminals Oa and Ob.

Thus, the voltage at terminal Ob is substantially equal to the voltage at terminal Jb; and the voltage at terminal Oa is substantially equal to the voltage at terminal Ja.

DESCRIPTION OF THE PREFERRED EMBODIMENT

Details of Construction of Preferred Embodiment

Figure 3A:
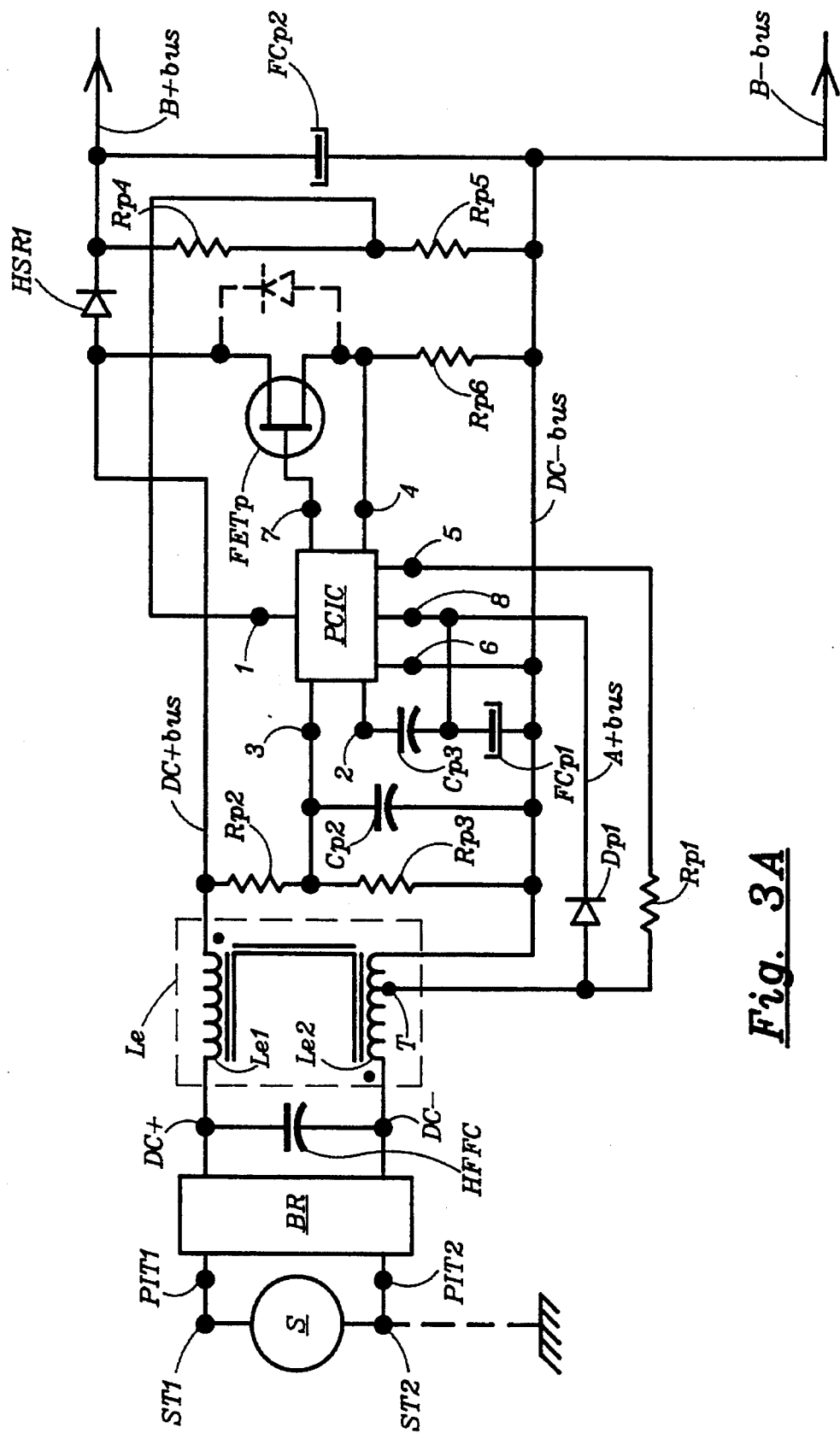
FIG. 3a shows a first part (the Pre-Converter Circuit) of the presently preferred embodiment.
Figure 3B:
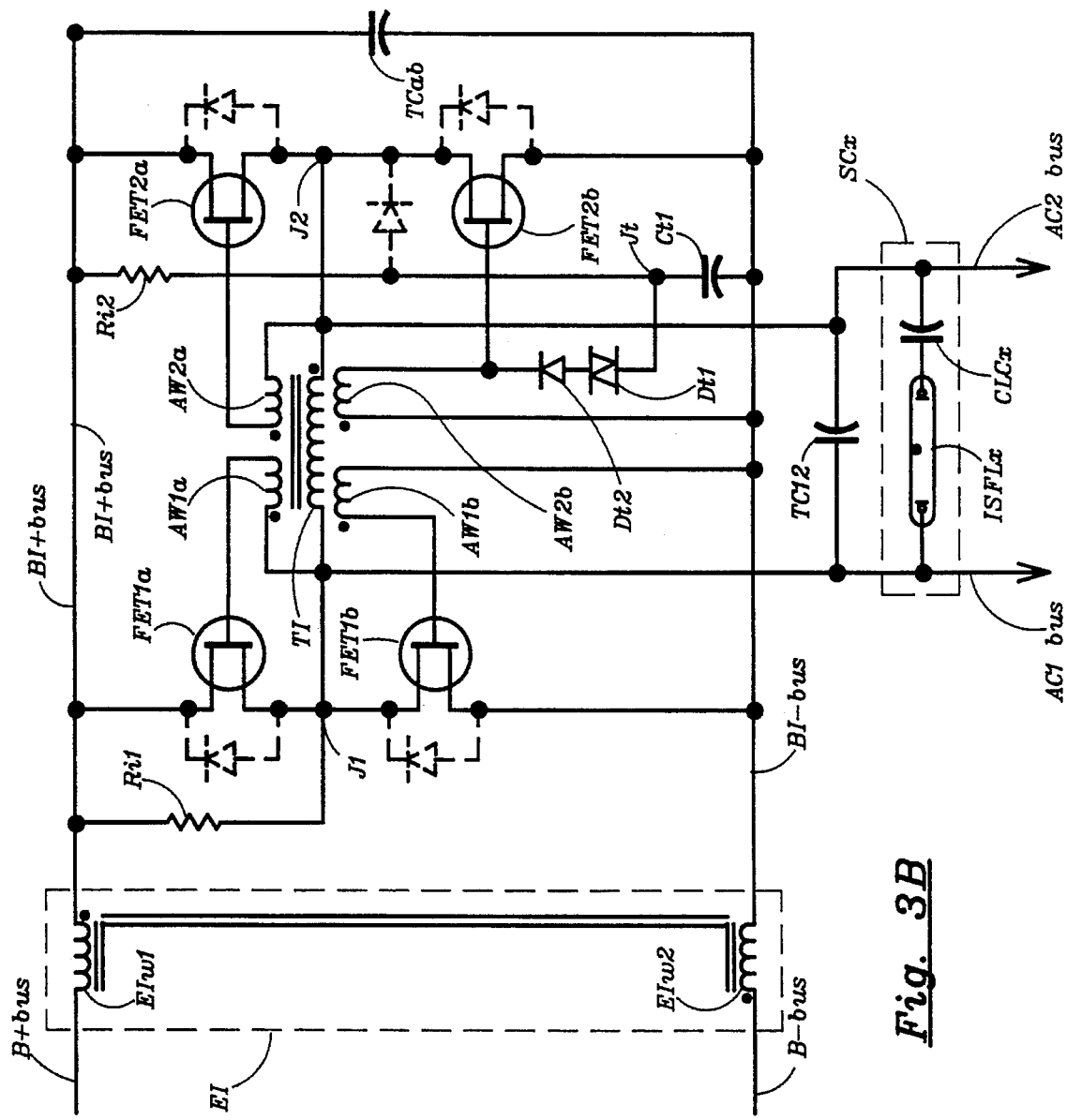
FIG. 3b shows a second part (the Bridge Inverter Circuit) of the presently preferred embodiment.

FIG. 3 is a schematic diagram of the preferred embodiment of the invention.

In FIG. 3, an ordinary electric utility power line is represented by a source S, whose source terminals ST1 and ST2 are connected with a pair of power input terminals PIT1 and PIT2 of a bridge rectifier BR; which bridge rectifier BR has two DC output terminals DC− and DC+. A high-frequency filtering capacitor HFFC is connected between the DC− terminal and the DC+ terminal.

A first winding Le1 of energy-storing inductor Le is connected between the DC+ terminal and a DC+ bus; which DC+ bus is connected with a B+ bus by way of a high-speed rectifier HSR1. A second winding Le2 of energy-storing inductor Le is connected between the DC− terminal and a DC− bus; which DC− bus is connected directly with a B− bus. 1B− bus. Windings Le1 and Le2 are two mutually coupled windings wound on a single magnetic structure.

A pre-converter PCIC is an integrated circuit (Motorola MC 34262) and has eight terminals 1–8. Terminal 8 is connected with an A+ bus; which A+ bus is also connected with the cathode of a diode Dp1, whose anode is connected with a tap T on winding Le2. A resistor Rp1 is connected between tap T and terminal 5 of PCIC. A filter capacitor FCp1 is connected between the A+ bus and the DC– bus; and a filter capacitor FCp2 is connected between the B– bus and the B+ bus.

A resistor Rn2 is connected between the DC+ bus and a terminal 3 of the PCIC; while a resistor Rn3 and a capacitor Cp2 are parallel-connected between terminal 3 and the DC– bus.

A capacitor Cp3 is connected between terminal 2 of the PCIC and the A+ bus; while terminal 6 is connected with the DC– bus. A resistor Rp4 is connected between the B+ bus and terminal 1; and a resistor Rp4 is connected between terminal 1 and the B– bus. Terminal 4 is connected with the DC– bus via a resistor Rp6.

A field effect transistor FETp is connected: (i) with its source terminal to terminal 4 of the PCIC, (ii) with its drain terminal to the DC+ bus, and (iii) with its gate terminal to terminal 7 of the PCIC.

The B+ bus is connected with a BI+ bus via a first winding EIw1 of an energy-storing inductor EI; while the B– bus is connected with a BI– bus via a second winding EIw2 of energy-storing inductor EI. Windings EIw1 and EIw2 are two mutually coupled windings on a single magnetic structure.

Each of field effect transistors FET1a and FET2a is connected with its drain terminal to the BI+ bus; and each of field effect transistors FET1b and FET2b is connected with its source terminal to the BI– bus. The source terminals of transistors FET1a and FET1b are connected with junctions J1 and J2, respectively; as are also the drain terminals of transistors FET1b and FET2b, as well as an AC1 bus and an AC2 bus, all respectively.

A tank inductor TI is connected between junction J1 and J2; which tank inductor has four auxiliary windings coupled thereto: AW1a, AW1b, AW2a, and AW2b; which windings are connected between the gate and source terminals of transistors FET1a, FET1b, FET2a, and FET2b, all respectively.

A first tank capacitor TCab is connected between the BI– bus and the BI+ bus; while a second tank capacitor TC12 is connected between junctions J1 and J2 (i.e., between the AC1 bus and the AC2 bus). A series-combination SCx of a first current-limiting capacitor CLCx and a first instant-start fluorescent lamp ISFLx is connected between the AC1 bus and the AC2 bus.

A resistor Ri1 is connected between the BI+ bus and junction J1; while a resistor Ri2 is connected between the BI+ bus and a junction Jt; a capacitor Ct1 is connected between junction Jt and the BI– bus; and a Diac Dt1 is connected between junction Jt and the anode of a diode Dt2, whose cathode is connected with the gate terminal of transistor FET2b.

Details of Operation of Preferred Embodiment

Figure 4A:
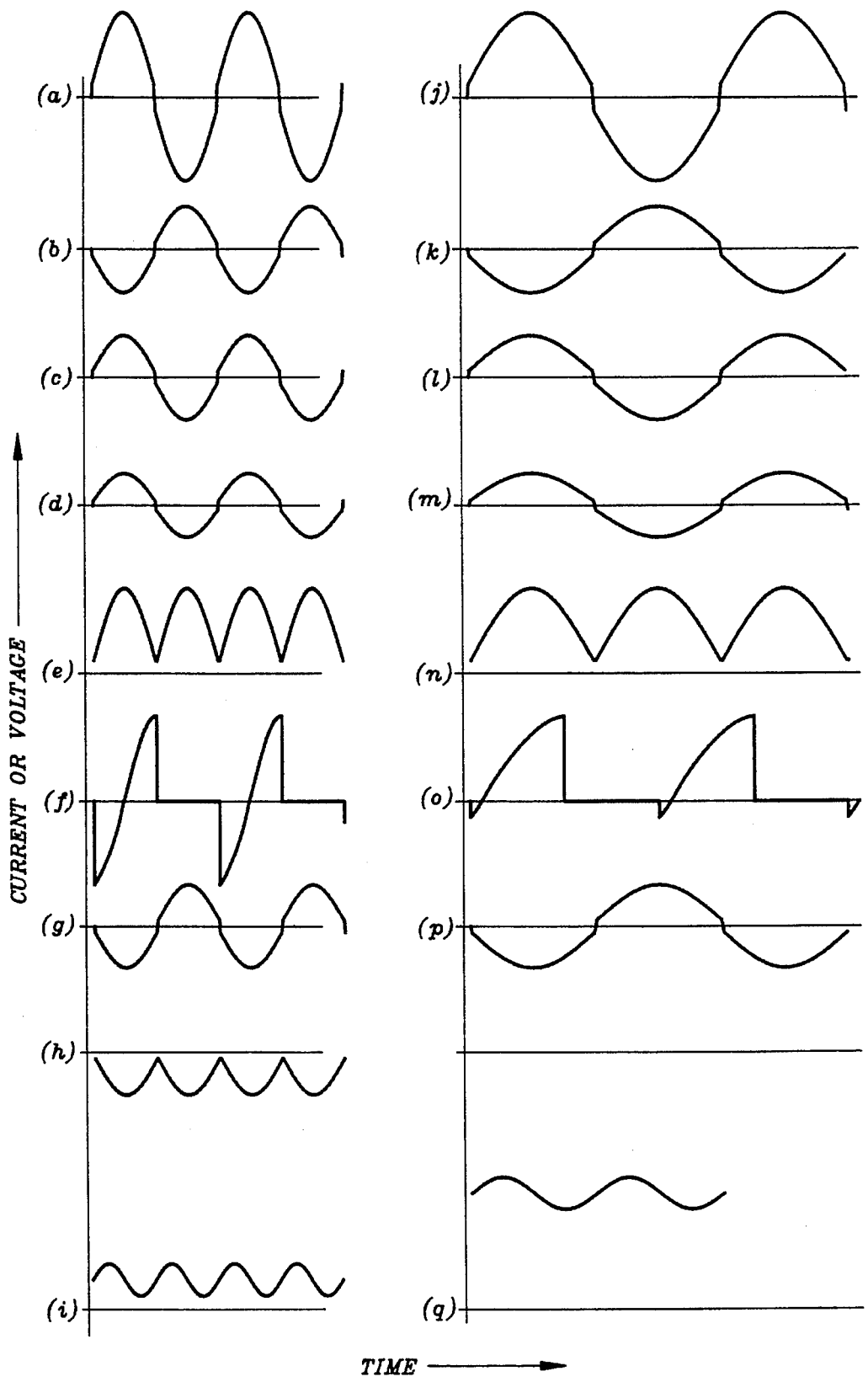
FIG. 4a shows various current or voltage waveforms mainly associated with the Bridge Inverter Circuit of FIG. 3b.
Figure 4B:
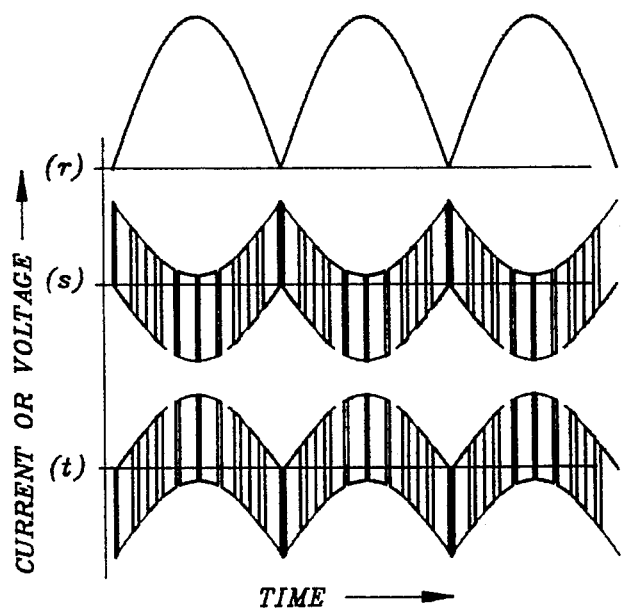

The operation of the preferred embodiment of FIG. 3 may best be understood by making reference to the voltage and current waveforms of FIG. 4; wherein:

Waveform (a) represents the high-frequency voltage existing between the AC1 bus and the AC2 bus under a condition of no load (i.e., with fluorescent lamp ISFLx removed);

Waveform (b) represents the high-frequency voltage existing between Earth Ground and the AC1 bus under no-load condition;

Waveform (c) represents the high-frequency voltage existing between Earth Ground and the AC2 bus under no-load condition;

Waveform (d) represents the voltage existing between the BI– bus and the gate of transistor FET1b (i.e., the gate-source drive voltage of transistor FET1b) under no-load condition;

Waveform (e) represents the voltage existing between the BI– bus and the BI+ bus under no-load condition;

Waveform (f) represents the current flowing through transistor FET1b under no-load condition;

Waveform (g) represents the AC voltage existing between the B– bus (or the B+ bus) and junction J1 (or J2) under a condition of no load; which is to say: disregarding any DC voltage component, waveform (d) represents the actual voltage existing between the B– bus (or the B+ bus) and junction J1 (or J2) under no-load condition;

Waveform (h) represents the voltage existing between the B– bus and the BI– bus under no-load condition;

Waveform (i) represents the current flowing between the B– bus and the BI– bus (or: between the BI+ bus and the B+ bus) under no-load condition;

Waveform (j) represents the high-frequency voltage existing between the AC1 bus and the AC2 bus under a condition of part Load (i.e., with fluorescent lamp ISFLx connected and functioning);

Waveform (k) represents the high-frequency voltage existing between Earth Ground and the AC1 bus under part-load condition;

Waveform (1) represents the high-frequency voltage existing between Earth Ground and the AC2 bus under part-load condition;

Waveform (m) represents the voltage existing between the BI– bus and the gate of transistor FET1b (i.e., the gate-source drive voltage of transistor FET1b) under part-load condition;

Waveform (n) represents the voltage existing between the BI– bus and the BI+ bus under part-load condition Waveform (o) represents the current flowing through transistor FET1b under part-load condition;

waveform (p) represents the AC voltage existing between the B– bus (or the B+ bus) and junction J1 (or J2) under part-load condition; which is to say: disregarding any DC voltage component, waveform (p) represents the actual voltage existing between the B– bus (or the B+ bus) and junction J1 (or J2) under part-load condition;

Waveform (q) represents the current flowing between the B– bus and the BI– bus (or: between the BI+ bus and the B+ bus) under part-load condition;

Waveform (r) represents the full-wave-rectified power line voltage existing between the DC– terminal and the DC+ terminal under part-load condition;

Waveform (s) represents the voltage existing between the DC+ terminal and the DC+ bus under part-load condition;

Waveform (t) represents the voltage existing between the DC– terminal and the DC– bus under part-load condition;

With reference to the waveforms of FIG. 4, the operation of the embodiment of FIG. 3 may now be described as follows.

As illustrated by waveform (r), full-wave rectification of the AC power line voltage from source S results in a pulsating (i.e., unfiltered) unidirectional voltage existing between the DC− terminal and the DC+ terminal. This unfiltered unidirectional voltage is supplied to a pre-converter circuit; which, except for using a split winding on its energy-storing inductor L, functions in a substantially ordinary manner, thereby to provide a filtered and regulated DC supply voltage between the B− bus and the B+ bus. {The complete assembly between the power line input terminals (PIT1, PIT2) and the DC supply voltage output terminals (i.e., the B− bus and the B+ bus) is referred-to as the Pre-Converter Circuit.}

The fact that energy-storing inductor L has two windings provides for two auxiliary benefits.

One auxiliary benefit is that of causing less electromagnetic interference (EMI) to be conducted from the Pre-Converter Circuit to the power line conductors; which benefit results for the reason that—just like any ordinary two-winding EMI choke—the split-winding energy-storing inductor L provides both common-mode and differential-mode attenuation of the EMI signals (unintentionally) generated in the Pre-Converter Circuit (and/or in the Bridge Inverter Circuit).

The other auxiliary benefit is that of maintaining symmetry of voltages and currents with respect to each of the power line supply terminals (ST1, ST2) (as well as with respect to earth ground); which symmetry facilitates the provision of a balanced AC output voltage from the AC output terminals of the Bridge Inverter Circuit (i.e., the AC1 bus and the AC2 bus).

As a consequence of the split-winding feature, the voltage existing between the DC+ terminal and the DC+ bus will be as shown by waveform (s), and the voltage existing between the DC− terminal and the DC− bus will be as shown by waveform (t). The sum of these two voltages would be equal to the voltage that would exist across the winding of an ordinary single-winding energy-storing inductor as used in an ordinary pre-converter circuit.

The filtered and regulated DC supply voltage from the Pre-Converter Circuit (which exists between the B− bus and the B+ bus) is provided to the Bridge Inverter Circuit, where it is applied between the BI+ bus and the BI− bus by way of windings EIw2 and EIw2, respectively.

Windings EIw1 and EIw2 are wound on a single magnetic structure (e.g., ferrite core) in a mutually coupled manner. Thus, they constitute a single energy-storing inductive entity; and, except for voltage and current symmetry considerations, the two windings could just as well have been combined into a single winding.

With the DC supply voltage applied between the BI− bus and the BI+ bus, the Bridge Inverter Circuit is triggered into self-oscillation, with the triggering being effected by elements Ri1, Ri2, Ct1, Dt1 and Dt2.

After triggering, the basic bridge inverter per se (i.e., the circuit assembly consisting of principal elements FET1a, FET1b, FET2a, FET2b, and TI ) will self-oscillate by way of the positive feedback provided via the auxiliary windings on tank-inductor TI (i.e., auxiliary windings AW1a, AW1b, AW2a and AW2b).

Although the average magnitude of the DC voltage present between the BI− bus and the BI+ bus must be equal to that of the DC supply voltage (as provided between the B− bus and the B+ bus), the instantaneous magnitude of this DC voltage will vary in synchronism with the oscillations of the bridge inverter.

The effect of tank-capacitors TCab and TC12 is that of making the waveform of the alternating voltage provided between the bridge inverter's output terminals (i.e., J1 and J2) substantially sinusoidal, with the frequency of oscillation being determined by the resonant interaction between these tank-capacitors and tank-inductor TI.

With the fluorescent lamp (ISFLx) non-connected (i.e., when supplying no output power), some of the voltage and current waveforms associated with the self-oscillating Bridge Inverter Circuit are as shown by waveforms (a) through (i) of FIG. 4.

In particular, it is noted that the high-frequency voltage existing between Earth Ground and the AC1 bus is equal in magnitude but opposite in phase as compared with the high-frequency voltage existing between Earth Ground and the AC2 bus.

Also, it is noted that the alternating voltage existing between the B− bus and junction J1 is equal to the high-frequency voltage existing between Earth Ground and the AC1 bus. Of course, the alternating voltage existing between the B+ bus and junction J1 is substantially identical to the alternating voltage existing between the B− bus and junction J1.

Since the voltage existing between the AC1 bus and the AC2 bus is substantially sinusoidal {see waveforms (a) and (j)}, and since this substantially sinusoidal voltage is the same as that existing across tank-inductor TI, the waveform of each of the gate-source drive voltages provided from auxiliary windings AW1a, AW1b, AW2a and AW2b will also be sinusoidal {see waveforms (d) and (m)}.

While it is unusual in a power-handling inverter to operate FET's with a sinusoidal gate-source drive voltage (as opposed to the usual squarewave gate-source drive voltage), such may indeed be done without incurring excessive power losses while at the same time averting damage to the FET's.

To minimize switching power losses, it is necessary that the peak magnitude of the sinusoidal gate-source drive voltage be significantly higher than the magnitude merely required to cause the FET to fully enter its ON-state; which means that the peak magnitude of a sinusoidal gate-source drive voltage must be significantly higher than the peak magnitude of a squarewave gate-source drive voltage (which is what is conventionally used for driving FET's in a power-handling inverter). In particular, in the Bridge Inverter Circuit of FIG. 3, the peak magnitude of the sinusoidal drive voltage provided to the gate-source inputs of each of the FET's is about 40 Volt; which is higher by a factor of four at compared with the peak magnitude required when a squarewave gate-source drive voltage is used.

While a peak voltage of 40 Volt is higher than the peak gate-source voltage normally considered permissible for power FET's, is indeed acceptable (i.e., without incurring damaging effects) with certain types of FET's, such as FET's of type IRF 721 from International Rectifier Corporation, El Segundo, Calif. With a sinusoidal drive voltage of 40 Volt peak magnitude, total power dissipation in the FET's in the Bridge Inverter Circuit was indeed acceptably low.

With the fluorescent lamp (ISFLx) connected (i.e., when supplying a moderate amount of output power), some of the voltage and current waveforms associated with the self-oscillating Bridge Inverter Circuit of FIG. 3 are as shown by waveforms (j) through (q) of FIG. 4.

It is noted that the frequency of the all the waveforms associated with the partially loaded condition is substantially lower than that of the no-load condition. This is so for the reason that, when the lamp is connected and operating, the voltage across it is very small (only about 150 Volt RMS) compared with the magnitude of the voltage present across the lamp-capacitor series-combination (about 500 Volt RMS); which means that this series-combination constitutes substantial additional capacitive loading on the inverter's basic tank-circuit (i.e., tank-inductor TI as combined with tank-capacitors TCab and TC12), thereby reducing the natural resonance frequency.

Additional Comments re Preferred Embodiment (aa) In some situations, to provide for affirmative triggering of the Bridge Inverter Circuit of FIG. 3, a resistor may be connected between the BI+ bus and junction J1.

(ab) In most situations, tank-capacitor TC12 may safely be eliminated; in which case tank-capacitor TCa should be increased in capacitance sufficiently to compensate for any undesirable increase in (no-load) oscillating frequency due to the removal of TC12.

(ac) As is the case with any ordinary electric utility power line, the power line conductors are electrically connected with earth ground, either directly or by way of a low-resistance path. In case of the circuit arrangement of FIG. 3, this connection is indicated by one of the power line conductors having electrical connection with Earth Ground.

(ad) With reference to waveform (a) of FIG. 4, as well as with reference to waveform (d), it is noted that the waveform of the inverter output voltage under no-load condition is sinusoidal except for a small portion of the total wave cycle. More particularly, during a very brief period at or near each cross-over point of the voltage wave, instead of having the usual slope associated with a sinusoidal wave, the wave has a notably steeper slope.

This slope-steepening is due to the fact that, during this very brief period, none of the four transistors is fully in its ON-state; which means that tank-capacitor TCab is, during this very brief period, at least partly disconnected from tank-inductor TI; which, in turn, causes the voltage across tank-conductor TI to rise at a higher rate; which higher rate is now limited by tank-capacitor TC12 only, as opposed to being limited by both tank-capacitors TC12 and TCab.

Of course, the slope-steepening effect on the waveform of the inverter's output voltage is directly reflected in the waveform of the gate-source drive voltage of each FET.

As indicated by waveforms (j) and (m), the slope-steepening effect is less pronounced under loaded conditions.

(ae) Since the fluorescent lamp (ISFLx) is ballasted by way of a capacitor, the slope-steepening effect referred-to in section (ad) above has the effect of causing an added spike or pulse in the instantaneous magnitude of the current provided to the fluorescent lamp; which spike or pulse occurs at or near each absolute-magnitude-peak of the otherwise substantially sinusoidal lamp current.

(af) With reference to FIG. 3, it should be understood that additional lamp-capacitor series-combinations may be connected between the AC1 bus and the AC2 bus (i.e., across the AC rails). However, the more such series-combinations so connected, the lower will be the frequency of oscillation of the inverter and thus the lower will be the frequency of the AC voltage provided between the AC1 bus and the AC2 bus; which correspondingly results in a lower magnitude of the current delivered through the series capacitors (i.e., the ballasting capacitors) to each lamp.

(ag) It is emphasized that waveforms (b), (c), (k) and (l) of FIG. 4 represent the waveforms of the high-frequency components of the actual voltages existing between Earth Ground and the AC1/AC2 buses under no-load and part-load conditions. However, it is important to realize that the waveforms of these actual voltages also include low-frequency components; which low-frequency components are not shown in the waveforms of FIG. 4.

In situations where the presence of such low-frequency components are found to be of concern with respect to passing the U.L. shock-hazard safety requirements (e.g., the so-called U.L Pin Test), it is noted that a high-pass filter (e.g., in the form a low-frequency blocking capacitor in series-connection with each of the AC1/AC2 buses) will mitigate such shock-hazard possibilities.

DESCRIPTION OF AN ALTERNATIVE PREFERRED EMBODIMENT

Details of Construction of Alternative Preferred Embodiment

Figure 5A:
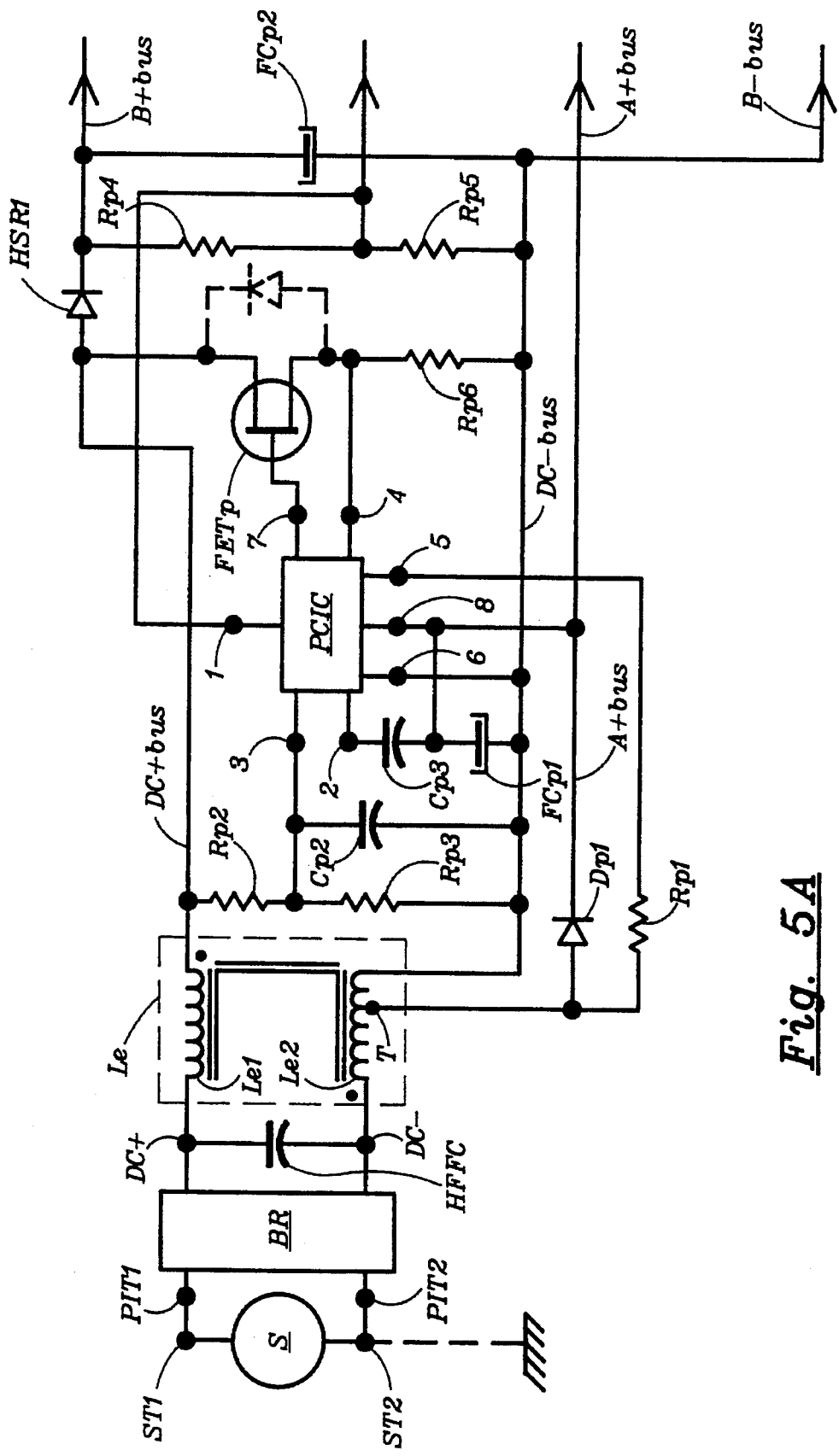
FIG. 5a shows a first part (the Pre-Converter Circuit) of the presently preferred embodiment of the invention.
Figure 5B:
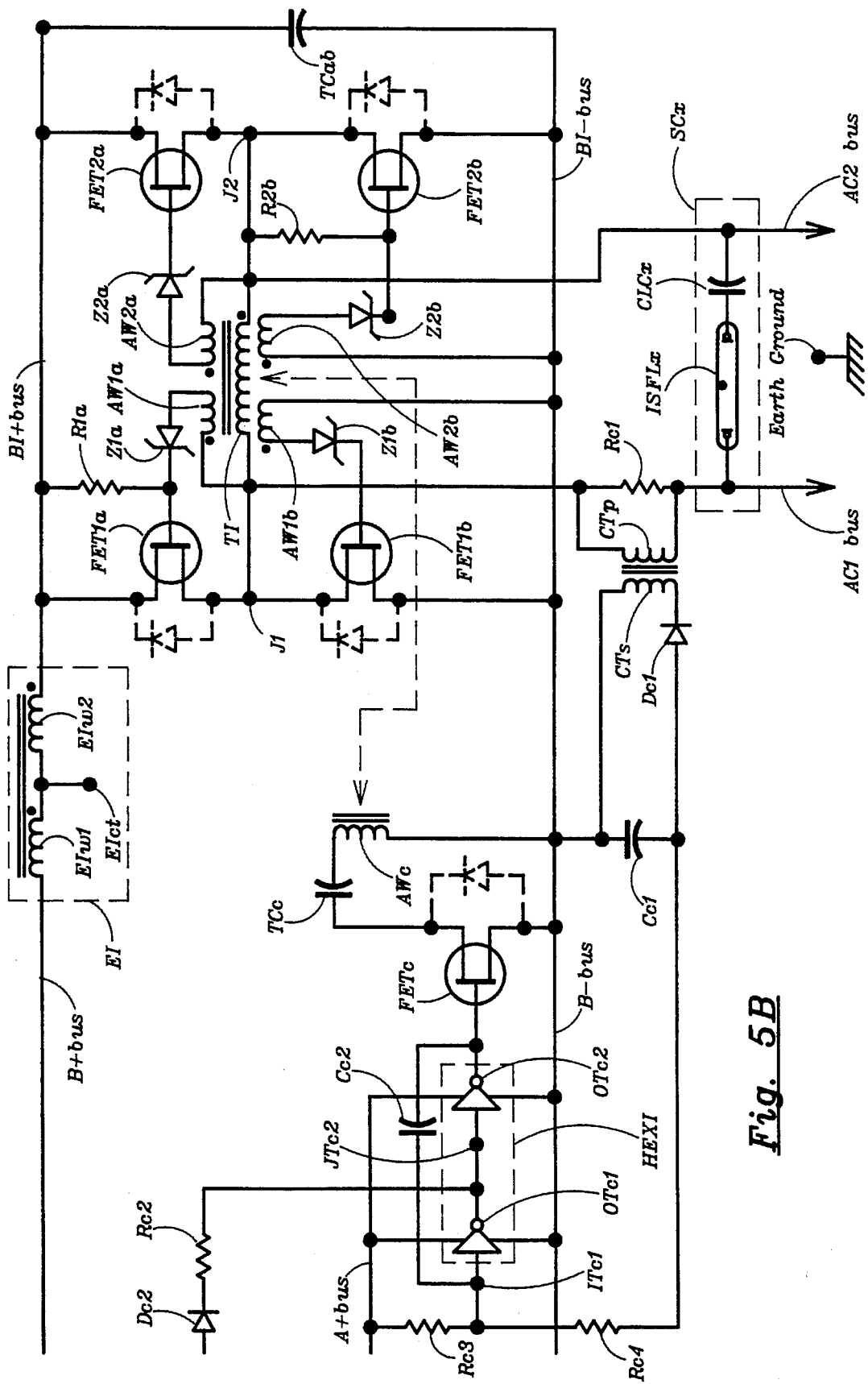
FIG. 5b shows a second part (the Bridge Inverter Circuit) of the presently preferred embodiment of the invention.

FIG. 5 is a schematic diagram of an alternative preferred embodiment of the present invention.

The arrangement of FIG. 5 is identical to that of FIG. 3 except for the following modifications.

Tank capacitor TC12 has been removed.

Elements Ri1, Ri2, Ct1, Dt1 and Dt2 have been removed.

A resistor R1a is connected between the drain terminal and the gate terminal of transistor FET1a; a resistor R2b is connected between the drain terminal and the gate terminal of transistor FET2b.

Zener diodes Z1a, Z1b, Z2a, Z2b are interposed between windings AW1a, AW1b, AW2a, AW2b and the gate terminals of transistors FET1a, FET1b, FET2a, FET2b, all respectively and in each case with the cathode of the Zener diode being connected with its associated gate terminal.

Winding EIw2 of inductor EI has been relocated such as to be connected directly in series with winding EIw1, thereby having both these windings series-connected between the B+ bus and the BI+ bus, thereby also leaving the B− bus connected directly with the BI− bus. The mid-point of the series-combined windings EIw1 and EIw2 is identified as center-tap EIct.

A resistor Rc1 has been inserted in series with the AC1 bus in such manner that whatever current flows from the AC1 bus must flow through resistor Rc1. Parallel-connected with resistor Rc1 is the primary winding CTp of a control transformer CT, whose secondary winding CTs is connected between the B− bus and the cathode of a diode Dc1, whose anode is connected with the B− bus by way of a capacitor Cc1.

An auxiliary winding AWc on tank inductor TI is connected with one of its terminals to the B− bus; the other one of its terminals being connected with the drain terminal of a field effect transistor FETc through a tank-capacitor TCc.

The source terminal of transistor FETc is connected with the B− bus; and the gate terminal of transistor FETc is connected with output terminal OTc2 of inverter Ic2 of a HEX Inverter HEXI. Input terminal ITc2 of inverter Ic2 is connected with output terminal OTc1 of inverter Ic1 of HEX inverter HEXI. Input terminal ITc1 of inverter Ic1 is connected with output terminal OTc2 of inverter Ic2 by way of a feedback capacitor Cc2.

A resistor Rc2 is connected between output terminal OTc1 and the cathode of a diode Dc2; a resistor Rc3 is connected between the A+ bus and input terminal ITc1 of inverter Ic1; while a resistor Rc4 is connected between input terminal ITc1 of inverter Ic1 and the anode of diode Dc1.

Details of Operation of Alternative Preferred Embodiment

Figure 6:
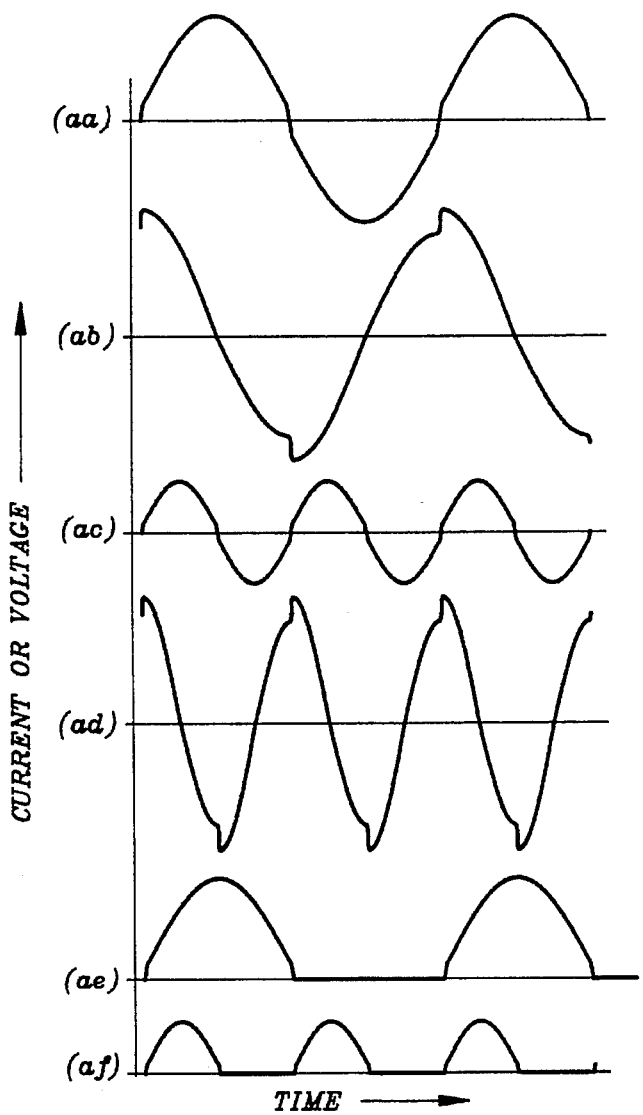
FIG. 6 shows various current or voltage waveforms mainly associated with the Bridge Inverter Circuit of FIG. 5b.

The operation of the alternative preferred embodiment of FIG. 5—to the extent that it differs from the operation of the preferred embodiment of FIG. 3—may best be understood by making reference to the voltage and/or current waveforms of FIG. 6; wherein:

Waveform (aa) represents the high-frequency voltage existing between the AC1 bus and the AC2 bus under a condition of less-than-full load (i.e., with fewer than all intended lamp-capacitor series-combinations—one of which would be SCx—connected between the AC1/AC2 buses).

Waveform (ab) represents the high-frequency current flowing through lamp ISFLx under the condition of less-than-full load.

Waveform (ac) represents the high-frequency voltage existing between the AC1 bus and the AC2 bus under a condition of full load (i.e., with all intended lamp-capacitor series-combinations connected between the AC1/AC2 buses).

Waveform (ad) represents the high-frequency current flowing through lamp ISFLx under the condition of full load.

Waveform (ae) represents the voltage present between the BI− bus and the drain terminal of transistor FET1b under a condition of less-than-full load.

Waveform (af) represents the voltage present between the BI− bus and the drain terminal of transistor FET1b under a condition of full load.

Now, with reference to the waveforms of FIGS. 4 and 6, the operation of the embodiment of FIG. 5 may be described as follows.

The Zener voltage of each of the Zener diodes (Z1a, Z1b, Z2a, Z2b) has been chosen such as to be slightly higher in magnitude than that of the gate voltage at which each of the transistors (FET1a, FET1b, FET2a, FET2b) starts conducting current between its source and drain. As a result, each transistor switches OFF a brief period later than it would have switched OFF without the Zener diodes; which, as compared with the arrangement of FIG. 3, leads to a reduction in the duration of the short period of time during which none of the transistors conduct.

As a bottom-line result—comparing exemplary waveform (a) of FIG. 4 with exemplary waveform (aa) of FIG. 6—the degree of slope-steepening at the cross-over points of the inverter's otherwise sinusoidal output voltage has been minimized; which, in turn, leads to a lamp current with better crest-factor as compared with the lamp current crest-factor associated with the arrangement of FIG. 3.

Also as a result of the Zener diodes, the bridge inverter can be biased (e.g., with resistors R1a and R2b) so as to cause two of the transistors to conduct, thereby to cause the inverter to self-start and thereby to eliminate the need for the Diac-type trigger circuit of FIG. 3.

Now, with particular reference to FIG. 5 (the part showing the Bridge Inverter Circuit) and waveforms (aa) & (ab) versus waveforms (ac) & (ad) of FIG. 6, prior to the fluorescent lamps having ignited, transistor FETc exists in its ON-state; which is to say that it exists in its fully conductive state. This is so because no current flows through resistor Rc1; which means that no negative voltage is present at the anode of diode Dc1; which means that input terminal ITc1 of inverter Ic1 will (via resistor Rc3) be pulled to a potential sufficiently positive to cause the two series- connected inverters IC1 and IC2 (via regenerative action resulting from the positive feedback supplied via capacitor Cc2) to enter a state whereby output terminal OTc2 goes positive all the way to the level of the A+ bus, thereby causing transistor FETc to enter its ON-state. Thereafter, until the lamps ignite, input terminal ITc1 remains positive to a degree sufficient to maintain output terminal OTc2 positive.

With transistor FETc in its ON-state, tank capacitor TCc is in effect connected in parallel with tank-capacitors TCa and TC12, thereby causing the natural oscillating frequency of the bridge inverter to be lower by a substantial factor compared with what it would be with transistor FETc in its OFF-state.

As soon as the lamps ignite, current will flow through resistor Rc1; which will give rise to a negative voltage developing at the anode of diode Dc1; which, if that negative voltage be of sufficient magnitude, will cause the magnitude of the voltage present at input terminal ITc1 to decrease in magnitude sufficiently to cause the two series-connected inverters IC1 and IC2 (again via regenerative action) to cause the magnitude of the voltage at output terminal OTc2 to fall to a level sufficiently low to render transistor FETc non-conductive.

In fact, when all lamps are connected and in operation, the magnitude of the negative voltage developed at the anode of diode Dc1 is just sufficient to cause the two series-connected inverters (Ic1, IC2) to regenerate, thereby to cause transistor FETc to enter its OFF-state, thereby to remove tank-capacitor TCc from the tank-inductor, thereby to cause the frequency of the inverter's AC output voltage (i.e., the AC voltage provided between the AC1 bus and the AC2 bus) to increase substantially; which, if the magnitude of this AC output voltage were to have remained the same, would have caused the magnitude of the lamp current to increase in proportion to the increase in frequency.

However, by action of diode Dc2 and resistor Rc2, the magnitude of the DC supply voltage will decrease simultaneously with the increase in frequency of the inverter's AC output voltage. This is so because output terminal OTc1 assumes a potential obverse to that of output terminal OTc2; which means that: (i) whenever transistor FETc is in its ON-state, output terminal OTc1 is at a potential close to that of the B− bus; which means that resistor Rc2 is in effect parallel-connected with resistor Rp5; which therefore causes the magnitude of the DC supply voltage to be regulated to a level substantially higher than the level to which it would be regulated without resistor Rc2 being so parallel-connected; and (ii) whenever transistor FETc is in its OFF-state, output terminal OTc1 is at a potential close to that of the A+ bus; which means that resistor Rc2 is now not parallel-connected with resistor Rp5; which means that the magnitude of the DC supply voltage be regulated at a level substantially lower than the level to which it be regulated when transistor FETc is in its ON-state.

Thus, as illustrated by the waveforms of FIG. 6: (i) whenever less than full load current is being drawn from the AC1 bus, the AC output voltage (i.e., the AC voltage provided between the AC1 bus and the AC2 bus) will have a relatively high RMS magnitude and a relatively low frequency; and (ii) whenever full load current is being drawn from the AC1 bus, the AC output voltage will have a relatively low RMS magnitude and a relatively high frequency.

Thus, if one or more lamps were to be removed during normal operation—such as would occur during an ordinary re-lamping procedure—the AC output voltage would increase in RMS magnitude but would decrease in frequency, thereby keeping the remaining lamp(s) properly powered. Yet, upon replacing all lamps (thereby re-establishing full load), the AC voltage would decrease in RMS magnitude while at the same time increasing in frequency.

An important reason for reducing the RMS magnitude of the AC output voltage when the ballast is operating at full power level is that of efficiency. For given sizes and/or ratings of components, the pre-converter (as well as the inverter) operates at higher efficiency when the magnitude of the DC supply voltage is lower. More particularly, the efficiency of the pre-converter increases with a reduction in the ratio between the absolute magnitude of the DC supply voltage and the peak absolute magnitude of the AC power line voltage.

For instance, with a given set of component parts, delivering 60 Watt of DC power at a DC rail voltage of about 350 Volt requires about 1.0 Watt more from a 120 Volt/60 Hz power line than delivering the same amount of DC power at a DC rail voltage of only 230 Volt.

Additional Comments re Alternative Preferred Embodiment (aa) The reason associated with removing tank-capacitor TC12 from the embodiment of FIG. 5 relates to two things:
1. The removal of tank-capacitor TC12 (even if the capacitance of tank-capacitor TCab were to be increased to provide for compensation in oscillating frequency) simply represents an economic advantage; and
2. The removal of tank-capacitor TC12 permits easier triggering of the inverter, thereby (in cases where the inverter circuit is provided with its DC supply voltage from a more-or-less ordinary pre-converter, such as is indeed the case in the embodiment of FIG. 5) permitting the removal of the trigger circuit consisting of elements Rt1, Ct1, Dt1 and Dt2 in exchange for a simpler trigger means connected in circuit between the pre-converter circuit and the gate-source terminals of transistor FET1b (or transistor FET2b), thereby taking advantage of the start of oscillations of transistor FETp to trigger the inverter circuit into self-oscillation.

For instance, triggering of the inverter circuit could be accomplished by way of an auxiliary winding on energy-storing inductor Le; which auxiliary winding would be coupled between the gate-source terminals of transistor FET1b by way of a resistor.

(ab) The frequency of operation of the inverter circuit of FIG. 3 is about 22 kHz when fully loaded. Yet, improved efficiency and/or reduced inductor sizes would result if it were possible to operate at higher frequencies when fully loaded. However, due to certain optical and/or electrical interference problems associated with certain commonly used in-building electronic control and communications systems (including particularly TV remote controls), it is important not to have electronic ballasts operate in the frequency range between 34 and 40 kHz (hereinafter the "forbidden frequency band").

In the embodiment of FIG. 5, due to the removal of tank-capacitor TC12, the frequency of operation of the inverter circuit is well in excess of 40 kHz when unloaded or partly loaded; yet, at about 32 kHz, it is safely under 34 kHz when fully loaded.

With a loaded operating frequency of 32 kHz, energy-storing inductor EI and tank-inductor TI can be substantially smaller and lighter-of-weight as compared with what would otherwise be required to attain a given efficiency level. Or, conversely, at given sizes and weights for the inductor elements, the operating efficiency would be substantially improved.

More particularly, the embodiment of FIG. 5 is characterized by operating above the forbidden frequency band during no-load and/or part-load conditions, while operating below the forbidden frequency band during fully loaded conditions.

In this connection, it is observed that presently available electronic ballasts of the so-called parallel-resonant type operate at frequencies of about 22 kHz when fully loaded.

(ac) It should be understood than many of the advantages associated with the full-bridge inverter circuit embodiments of FIGS. 3 and 5 may be attained as well with half-bridge and/or so-called parallel push-pull embodiments.

(ad) In ordinary electronic ballasts of the half-bridge parallel-resonant type—such as sold by Electronic Ballast Technology (EBT), Inc. of Torrance, Calif.—the peak magnitude of the voltage existing across each of the two inverter transistors is higher than (or at least as high as) half of the magnitude of the inverter's DC supply voltage multiplied by pi (i.e., 3.14). Thus, with a DC supply voltage of (say) 200 Volt, the peak magnitude of the voltage across one of the inverter transistors would usually be higher than (but would be at least as high as) 314 Volt.

In electronic ballasts of the push-pull parallel-resonant type—such as sold by Triad-Utrad (a unit of MagneTek, Inc. of Los Angeles, Calif.)—the peak magnitude of the voltage existing across each of the two inverter transistors is normally higher than (but is at least as high as) the magnitude of the inverter's DC supply voltage multiplied by pi (i.e., 3.14). Thus, with a DC supply voltage of (say) 200 Volt, the peak magnitude of the voltage across one of the inverter transistors would be at least 628 Volt.

In an electronic ballast built in accordance with the circuit arrangement of FIG. 1 herein, and as long as operating with the waveforms marked (a), (b) or (c) of FIG. 2 herein, the peak magnitude of the voltage across each one of the four inverter transistors will be higher than (or at least as high as) half of the magnitude of the inverter's DC supply voltage multiplied by pi (i.e., 3.14). Thus, with a DC supply voltage of (say) 200 Volt, the peak magnitude of the voltage across one of the inverter transistors in the circuit of FIG. 1—when operating with waveforms (a)–(c)—would be at least 314 Volt.

In an electronic ballast built in accordance with the circuit arrangement of FIG. 1 herein, and as long as operating with the waveform marked (d) of FIG. 2 herein, the peak magnitude of the voltage across each one of the four inverter transistors will be lower than half of the magnitude of the inverter's DC supply voltage multiplied by pi (i.e., 3.14). Thus, with a DC supply voltage of (say) 200 Volt, the peak magnitude of the voltage across one of the inverter transistors in the circuit of FIG. 1—when operating with waveform (d)—would be less than 314 Volt.

In an electronic ballast built in accordance with the circuit arrangement of FIGS. 3 or 5 herein, the peak magnitude of the voltage across each one of the four inverter transistors will be lower than half of the magnitude of the inverter's DC supply voltage multiplied by pi (i.e., 3.14). Thus, with a DC supply voltage of (say) 200 Volt, the peak magnitude of the voltage across one of the inverter transistors in the circuit of FIG. 3 (or FIG. 5) would be less than 314 Volt.

In an electronic ballast built in accordance with the principles of the circuit arrangements of FIGS. 3 or 5 herein —even if using a half-bridge configuration instead of the illustrated full-bridge configuration—the peak magnitude of the voltage across each one of the two half-bridge inverter transistors would be lower than half of the magnitude of the inverter's DC supply voltage multiplied by pi (i.e., 3.14). Thus, with a DC supply voltage of (say) 200 Volt, the peak magnitude of the voltage across one of the two half-bridge inverter transistors would then be less than 314 Volt.

In an electronic ballast built in accordance with the principles of the circuit arrangements of FIGS. 3 or 5 herein —even if using a push-pull configuration instead of the illustrated full-bridge configuration—the peak magnitude of the voltage across each one of the two push-pull inverter transistors would be lower than the magnitude of the inverter's DC supply voltage multiplied by pi (i.e., 3.14). Thus, with a DC supply voltage of (say) 200 Volt, the peak magnitude of the voltage across one of the two push-pull inverter transistors would then be less than 628 Volt.

(ae) The reason why—for a given circuit topography and a given magnitude of DC supply voltage—the peak magnitude of the voltage existing across each transistor in the inverters of ordinary parallel-resonant-type electronic ballasts is higher than the peak magnitude of the voltage existing across each transistor in the inverter of an electronic ballast based on the parallel-resonant principles of the embodiments of FIGS. 3 and 5 herein is a result of the following basic difference: in the inverters of ordinary parallel-resonant electronic ballasts, no provision has been provided whereby—at least for a very brief period—none of the inverter's switching transistors is permitted to exists in its switched-ON or conductive state.

That is, in ordinary parallel-resonant electronic ballasts, usual practice is for one transistor to be switched OFF only after its obverse transistor has been switched ON {thereby having a situation where—for a brief period each half-cycle—both of two obverse (i.e., alternatingly switched) transistors are ON at the same time}; whereas, in the inverter circuit of FIGS. 3 and 5, provisions are made whereby one of the transistor is indeed switched OFF a short period before its obverse transistor has been switched ON, thereby providing for a situation where—at least for a very brief period of time —not one of a pair of obverse transistors (e.g., FET1b and FET2a) exists in a state of being switched ON.

(af) With reference to FIGS. 3 and 5, in some cases it may be non-feasible to provide between inverter output terminals J1 and J2 an AC voltage of the exact RMS magnitude required to exist between the AC1 bus and the AC2 bus for proper lamp ignition and operation. In such cases, an auto-transformer approach may be used to increase or decrease the RMS magnitude of the AC voltage provided between the AC1/AC2 buses. That is, tank-inductor TI may be integrally combined with an auto-transformer without having to add a separate transformer means.

(ag) In the bridge inverter circuits of FIGS. 3 and 5, the drive voltage provided between the gate-source terminals of each of transistors FET1a, FET1b, FET2a and FET2b—see waveform (d) of FIG. 4—is of substantially sinusoidal waveform and of a peak magnitude substantially higher than what's just required to cause each transistor to enter its fully conductive state.

Typically, the magnitude of the gate-source voltage required for causing a field effect transistor (such as FET1a, FET1b, FET2a and FET2b) to enter is full-conduction state (i.e., its full-ON state) is no higher than about 10 Volt; which means that if a squarewave-shaped drive voltage had been used for driving these FET's, its peak magnitude would not have had to be higher than about 10 Volt. However, since the FET's in the bridge inverter circuit arrangements of FIGS. 3 and 5 are provided with a substantially sinusoidally-shaped drive voltage, it is clear that the peak magnitude of this drive voltage has to be higher than 10 Volt.

In different implementations of the circuits of FIG. 3, sinusoidally-shaped base-source drive voltages of peak magnitudes from as low as 20 Volt to as high as 40 Volt have been successfully used. Except for possible long term detrimental consequences with respect to FET operating life, the higher peak magnitudes are preferable because of correspondingly (though not proportionally) better switching efficiency and correspondingly (though not proportionally) lower lamp current crest factor.

With respect to the arrangement of FIG. 3, and with further reference to waveform (ab) of FIG. 6, the magnitude of the bumps or pulses present at or near the peaks of each wave-crest of the lamp current diminishes with increased magnitude of gate-source drive voltage, thereby correspondingly resulting in an improved (i.e., reduced) lamp current crest factor.

Also with reference to FIG. 3 and waveform (ab) of FIG. 6, another way of reducing the magnitude of the bumps or pulses present at or near the peaks of each wave-crest of the lamp current—thereby to improve the crest-factor (though not necessarily the switching efficiency)—is that of placing a resistor in series with the input to each gate of each FET.

(ah) To facilitate triggering of the bridge inverter of FIG. 3, a resistor Ri1 is connected between the BI+ bus and junction J1.

(ai) With reference to FIG. 3, to stop continued triggering action after the inverter has attained self-sustaining oscillation, the anode of a diode may be connected with junction Jt and the cathode of the same diode may be connected with the drain terminal of transistor FET2b.

(aj) With reference to FIG. 5, so as to cause only a small drop in the magnitude of the current flowing through resistor Rc1 to cause transistor FETc to enter its switched-ON state, conventional hysteresis prevention measures may be used.

(ak) With reference to FIG. 5, the Zener diodes (Z1a, Z1b, Z2a, Z2b) provide for an effect quite similar to that of placing a resistor in series with each gate of each FET {as discussed in section (ag) above}; which is to say that they provide for a reduction in the cross-over distortion associated with waveform (a) of FIG. 4, reducing it to a level such as indicated by waveform (aa) of FIG. 6.

(al) In FIG. 5, to permit more leeway in the specifications required of the FET's and the Zener diodes, it is advantageous to bias each of transistors FET1a and FET2b, not only with a single resistor from gate to drain, but also with a resistor from gate to source; which is to say: biasing each of those two transistors by way of a voltage divider.

(am) To protect against electric shock hazard, which otherwise might result due to low-frequency power line voltage being present between Earth Ground and either the AC1 bus and/or the AC2 bus, a low-frequency blocking capacitor may be interposed in series with each of the AC1 bus and the AC2 bus.

(an) The ballasting arrangements of FIGS. 3 and 5 may effectively be used for Rapid-Start ("R.S.") fluorescent lamps as well; in which case low-voltage cathode heating power would be provided by way of auxiliary windings on tank-inductor TI.

To meet the so-called U.L. Pin Test without resorting to using an output (or power line) isolation transformer or an active Ground-Fault ("G.F.") prevention means, R.S. fluorescent lamps may be parallel-powered from the AC output rails (i.e., from the AC1/AC2 buses)—with each R.S. lamp being series-connected with a ballast capacitor to form an R.S. Lamp-Capacitor series-combination, and with each such series-combination being connected directly between the AC buses. Then, as long as the RMS magnitude of the AC output voltage (i.e., the AC voltage provided between the AC buses) is not much higher than what is required for proper rapid-starting of a single R.S. fluorescent lamp, shock-hazard-safe operation will result even in the absence of power line isolation transformer or G.F. prevention means.

(ao) Although tank-capacitor TCab is not connected directly in parallel across tank-inductor TI, it nevertheless functions as a parallel-connected tank-capacitor, thereby making the Bridge Inverter Circuit of FIG. 3 (and that of FIG. 5 as well) a parallel-resonant inverter or ballast circuit. This is so for the reason that—by way of the alternatingly switched bridge transistors—tank-capacitor TCab is commutated in such manner as to interact with the tank-inductor as if it were parallel-connected therewith.

(ap) In the Bridge Inverter Circuit of FIGS. 3 and 5, the exact value of the inductance of inductor EI is not highly critical to the efficient operation of the inverter. Yet, the higher the value of this inductance, the lower the amount of high-frequency ripple current that has to be handled by filter capacitor FCp2.

With reference to waveform (q) of FIG. 4, under a partly loaded condition, the current flowing through the windings of inductor EI is of a relatively high unidirectional magnitude with but a modest amount of high-frequency ripple.

(aq) With reference to the Bridge Inverter Circuits of FIGS. 3 and 5, instead of connecting each auxiliary winding on tank-inductor TI (e.g., AW1b) directly across the gate-source terminals of transistor FET1b, it may in some cases (such as when necessary to limit the peak magnitude of the voltage provided across the gate-source terminals) be preferable to connect the auxiliary winding thereacross by way of a resistor, while at the same time connecting a pair of series-connected back-to-back Zener diodes across the gate-source terminals. That way, even when supplied by a sinusoidal voltage from the auxiliary winding, the drive voltage presented to the gate-source terminals will be closer to a squarewave.

(ar) With reference to FIGS. 3 and 5, it is emphasized that series-combination SCx is merely representative of a plurality of such series-combinations which may all be parallel-connected with each other between the AC1 bus and the AC2 bus (i.e., across the AC rails).

(as) With reference to FIG. 5, in situations where Rapid-Start fluorescent lamps are to be powered from the Bridge Inverter Circuit, cathode heating voltage may advantageously be obtained by way of a small transformer having its primary winding connected in parallel with tank-capacitor TCc, and each of its secondary windings connected with a cathode. That way, cathode heating power would be provided only until all lamps had ignited. Thereafter, as soon as tank-capacitor TCc is switched out by way of transistor FETc, cathode power would cease to be provided, thereby providing for a situation of extra high ballast efficacy factor.

(at) With reference to FIG. 5, in situations where control of light output is desired, the ON/OFF control of transistor FETc can be effectuated by way of an external control means istead of by the automatic action shown.

Thus, for instance, resistor Rc4 may be removed; and control of HEXI—and thereby transistor FETc—may be effectuated by an external battery and switch.

Or, the gate terminal of FETc may be removed from HEXI's terminal OTc2 and connected instead to an external battery by way of a switch.

Alternatively, additional tank-capacitors may be switched in/out by way of additional transistors—with each additional tank-capacitor being switched in/out by its own transistor; and with each tank-capacitor/transistor combination being parallel-connected across winding AWc.

Thus, by switching in/out additional tank-capacitors, the amount of power delivered to the gas discharge lamps powered by the parallel-resonant-type electronic ballast of FIG. 5 may be controlled over a relatively wide range; something which is not possible to accomplish with ordinary parallel-resonant-type electronic ballasts.

Also, the amount of powered delivered to the gas discharge lamps may be controlled to an additional degree by controlling the magnitude of the DC supply voltage; which can be effectuated by controlling the magnitude of the resistance placed in parallel with resistor Rp5.

In this connection it is important to note that only gas discharge lamps with externally heated cathodes (e.g., Rapid-Start fluorescent lamps) are suitable for wide-range control of lamp power.

(au) With reference to section (at) above, it is noted that in situations where electrical isolation from the power line is desired, external lamp power control can be effectuated with one or more tank-capacitors being switched in/out across a separate auxiliary winding (e.g., a winding labeled AWi) on tank-inductor TI.

(av) With respect to current flowing through an ordinary transistor, forward current is defined as the current flowing between the source terminal and the drain terminal in case of a field-effect transistor, or between the emitter terminal and the collector terminal in a bi-polar transistor, without flowing through any built-in commutating diode or diode-junction. Thus, whereas the magnitude of any reverse current which might flow through a transistor (e.g., through a built-in commutating diode) can not be controlled by way of the transistor's control terminals, the magnitude of the forward current can be controlled by application of a controllable voltage (in case of FET's) or current (in case of bi-polar transistors) to the transistor's control input terminals (i.e., the gate-source terminals of a FET or the base-emitter terminals of a bi-polar transistor).

(aw) The term "substantially sinusoidal waveform" is to be understood to apply to a waveform where, with respect to a purely sinusoidal waveform, the total harmonic distortion is no higher than 20%.

This definition notwithstanding, the total harmonic distortion of the various substantially sinusoidal waveforms associated with the inverter circuits of FIGS. 3 and 5 {e.g., waveforms (a) through (d), (g), (i), (j) through (m), (p), (q), (aa) and (ac) of FIGS. 4 and 6} is actually only about 10% or less.

(ax) In the inverter circuits of FIGS. 3 and 5, and as indicated by waveform (ae) and (af), a periodically pulsed unidirectional voltage exists across each field-effect transistor (e.g. FET1a); with each individual voltage pulse being equal to a complete half-cycle of a substantially sinusoidal voltage; with each such half-cycle being defined as having its beginning and its end at a cross-over point; with a cross-over point being defined as a point at which the instantaneous magnitude of the substantially sinusoidal voltage reverses polarity.

(ay) Even though not expressly so indicated, the fluorescent lamps of FIGS. 3 and 5 are disconnectable.

(az) With reference to waveforms (ad) and (ac) of FIG. 6, the current flowing through fluoresent lamp ISFLx (i.e., the lamp current) has a waveform which is composed of two principal components: (i) a substantially sinusoidal wave component of relatively large magnitude; and (ii) a squarewave component of relatively small magnitude.

The squarewave component is characterized as having cross-over points (i.e., phasing) displaced by about one quarter period (i.e., by about 90 degrees) from the cross-over points of the sinusoidal wave component.

The peak-to-peak magnitude of the squarewave component is equal to the height of the voltage-step occurring at the crest of the lamp current waveform.

(ba) Inductor EI (i.e., the inverter's feed inductor) may be located in series with either conductor connecting the bridge inverter to the source of DC supply voltage. However, to minimize EMI, as well as to minimize electric shock hazard associated with the inverter's output terminals (i.e., the AC1.AC2 buses), the feed inductor should be split, as indicated in FIG. 3.

(bb) In ordinary parallel-resonant-type electronic ballasts, the peak magnitude of the voltage existing across each transistor in the ballast's inverter is larger than pi times half of the magnitude of the DC voltage supplying the inverter, where pi is equal to 3.14.

In fact, in a parallel-resonant-type electronic ballast of the kind presently available in the U.S. market, such peak magnitudes were measured to exceed 3.4 times the magnitude of the DC supply voltage.

(bc) With reference to FIG. 5, it is noted that the complete inverter circuit used for converting the DC supply voltage (i.e., the DC voltage provided between the B− bus and the B+ bus) to the substantially sinusoidal AC output voltage (i.e., the voltage provided between junctions J1 and J2) consists of only 13 individual components, namely: EI, TI, TCab, FET1a, FET1b, FET2a, FET2b, Z1a, Z1b, Z2a, Z2b, R1a and R2b.

I claim:

1. An arrangement comprising:

a DC source operative to provide a DC supply voltage at a pair of DC supply terminals;

a loading means including an electric lamp and a pair of load terminals; and inverter circuit having a pair of DC input terminals connected with the DC supply terminals and a pair of AC output terminals connected with the load terminals; the inverter circuit being characterized by providing across the AC output terminals an AC output voltage characterized by having (i) a first fundamental period consisting of two first half-periods of approximately equal duration but of opposite polarity, each first half-period starting and ending at a voltage cross-over point at which the instantaneous magnitude of the AC output voltage changes polarity, and (ii) a first waveform being sinusoidal except for a first brief period in near proximity of each voltage cross-over point, during which first brief period the slope of the first waveform is distinctly steeper than it would have been if it had remained of sinusoidal waveform throughout the first brief period; the inverter circuit being further characterized by including (i) tank-inductor means, (ii) tank-capacitor means, (iii) transistors connected in circuit with the tank-inductor means and the tank-capacitor means, each transistor having transistor control terminals, and (iv) drive voltage assembly connected with the transistor control terminals and operative to provide transistor drive voltages thereto; the drive voltage assembly being further operative to cause each transistor to periodically alternate between being conductive and being non-conductive; the transistors being rendered conductive and non-conductive at such particular moments in time as to cause the AC output voltage to assume said first waveform.

2. The arrangement of claim 1 wherein the loading means is further characterized by including a gas discharge lamp series-connected with a capacitive reactance means.

3. The arrangement of claim 2 wherein: (i) an alternating lamp current flows through the gas discharge lamp; which alternating lamp current is characterized by (i) having a second fundamental period consisting of two second half-periods of approximately equal duration but of opposite polarity, each second half-period starting and ending at a current cross-over point at which the instantaneous magnitude of the alternating lamp current changes polarity, and (ii) a second waveform that is essentially sinusoidal except for a second brief period occurring once during each second half-period, during which second brief period the instantaneous absolute magnitude of the lamp current is notably higher than it would have been if the second waveform were to have remained essentially sinusoidal throughout the second brief period.

4. The arrangement of claim 1 wherein the transistors include a first field-effect transistor.

5. The arrangement of claim 4 wherein the first field-effect transistor has a first pair of gate-source terminals across which is provided a first AC drive voltage; which first AC drive voltage is derived by way of positive feedback from the AC output voltage.

6. The arrangement of claim 5 wherein the first AC drive voltage has a waveform that is substantially equal to that of the AC output voltage.

7. The arrangement of claim 4 wherein the transistors also include a second periodically conducting field-effect transistor; the source terminal of the second field-effect transistor being connected with the drain terminal of the first field-effect transistor; a pulsating unidirectional voltage existing between the source terminal of the first field-effect transistor and the drain terminal of the second field-effect transistor; the peak magnitude of the pulsating unidirectional voltage being higher than the magnitude of the DC supply voltage.

8. The arrangement of claim 7 wherein the source terminal of the first field-effect transistor and the drain terminal of the second field-effect transistor are connected in series-circuit with the DC input terminals by way of an inductor means.

9. The arrangement of claim 8 wherein the inductor means includes a first and a second winding so arranged that: (i) the first winding is connected between the source terminal of the first field-effect transistor and one of the DC input terminals; and (ii) the second winding is connected between the drain terminal of the second field-effect transistor and the other one of the DC input terminals.

10. The arrangement of claim 8 wherein the first periodically conducting field-effect transistor is conductive only during times when the second periodically conducting field-effect transistor is non-conductive.

11. The arrangement of claim 10 wherein neither of the two periodically conducting field-effect transistors conducts during at least part of said first brief period.

12. The arrangement of claim 1 wherein the inverter circuit is further characterized by including four periodically conducting transistors connected in the manner of a full-bridge inverter; none of the four transistors conducting during at least part of said first brief period.

13. An arrangement comprising:

a DC source operative to provide a DC supply voltage at a pair of DC supply terminals;

a loading means including a gas discharge lamp and a pair of load terminals; and DC-to-AC inverter circuit having a pair of DC input terminals connected with the DC supply terminals and a pair of AC output terminals connected with the load terminals; the DC-to-AC inverter circuit being operative to provide an AC output voltage across the AC output terminals and being otherwise characterized by including a periodically conducting transistor integrally including a pair of transistor control terminals having a periodic control signal existing thereacross; the periodic control signal having a fundamental period and a substantially sinusoidal waveshape; the DC-to-AC inverter circuit also including a transistor control signal source connected with the transistor control terminals and operative to provide said periodic control signal thereto.

14. The arrangement of claim 13 wherein the DC-to-AC inverter circuit is further characterized by including four periodically conducting transistors.

15. The arrangement of claim 14 wherein, at least once for a brief time during each fundamental period, a situation exists wherein none of the four transistors conducts current in its forward direction.

16. The arrangement of claim 13 wherein: (i) a pulsating unidirectional voltage exists across the transistor; and (ii) the peak magnitude of this pulsating DC voltage is substantially higher than the magnitude of the DC supply voltage, but lower than one half of pi (i.e., one half of 3.14) times the magnitude of the DC supply voltage.

17. The arrangement of claim 13 wherein the AC output voltage is characterized by having: (i) an instantaneous magnitude that periodically alternates between being of a positive polarity and being of a negative polarity; (ii) a period, within which there are cross-over points at which the instantaneous magnitude reverses polarity; and (iii) a waveform that is sinusoidal except for a brief time-span near each cross-over point; during which brief time-spans the rate-of-change of the instantaneous magnitude is substantially higher than it would have been had the waveform remained sinusoidal during each brief period.

18. The arrangement of claim 13 where the AC output voltage is characterized by having: (i) an instantaneous magnitude that alternates periodically between a positive polarity and a negative polarity; (ii) a period within which there are cross-over points at which the instantaneous magnitude reverses polarity; and till) a waveshape that is substantially sinusoidal; with the only significant deviation from a sinusoidal waveform occurs only for a brief period at or near each cross-over point; during which brief period the rate-of-change of the instantaneous magnitude is significantly higher than it otherwise would have been.

19. An arrangement comprising:

a DC source operative to provide a DC supply voltage at a pair of DC supply terminals;

a loading means including a gas discharge lamp and a pair of load terminals; and DC-to-AC inverter circuit having a pair of DC input terminals connected with the DC supply terminals and a pair of AC output terminals connected with the load terminals; the DC-to-AC inverter circuit being operative to provide an AC output voltage across the AC output terminals; the AC output voltage being characterized by having: (i) an instantaneous magnitude that alternates periodically between a positive polarity and a negative polarity; (ii) a period within which there are cross-over points at which the instantaneous magnitude reverses polarity; and (iii) a waveshape that is substantially sinusoidal; with the only significant deviation from a sinusoidal waveform occurring only for a brief period at or near each cross-over point; during which brief period the rate-of-change of the instantaneous magnitude is significantly higher than it would have been had the waveform remained sinusoidal during the brief period; the DC-to-AC inverter circuit being additionally characterized by including: (i) tank-inductor means, (ii) tank-capacitor means, (iii) transistors connected in circuit with the tank-inductor means and the tank-capacitor means, each transistor having control terminals, and (iv) drive voltage assembly connected with the control terminals and operative to provide transistor drive voltages thereto; the drive voltage assembly being operative to cause each transistor to periodically alternate between being conductive and being non-conductive; the transistors being rendered conductive and non-conductive at such particular moments in time as to cause the AC output voltage to assume said first waveshape.

20. An arrangement comprising:

a DC source operative to provide a DC supply voltage at a pair of DC supply terminals;

a loading circuit having a pair of load terminals and including a number of gas discharge lamps, any one or more of which lamps may be disconnected; and an inverter circuit having a pair of DC input terminals connected with the DC supply terminals and a pair of AC output terminals connected with the load terminals; the inverter circuit being operative to provide an AC output voltage across the AC output terminals; the frequency of the AC output voltage varying with the number of connected lamps included in the loading circuit; the frequency of the AC output voltage being relatively high whenever none or just one of the lamps is connected and relatively low whenever more than one of the lamps are connected; the inverter circuit being further characterized by including a collection of interconnected elements including (i) inductor means connected in circuit with the DC input terminals, (ii) a periodically conducting first transistor with an integral first transistor terminal having electrical connection with the inductor means, and (iii) an L-C circuit having electrical connection with the inductor means as well as with the first transistor terminal; the collection of interconnected elements being operative to cause an alternating voltage of approximately sinusoidal waveform to exist between the first transistor terminal and one of the DC input terminals.

21. The arrangement of claim 20 wherein the inverter circuit is still further characterized by also including a periodically conducting second transistor with an integral second transistor terminal; which second transistor terminal is connected with the first transistor terminal.

22. The arrangement of claim 20 wherein the collection of interconnected elements is additionally functional such that, except for certain brief periods within each complete cycle of the AC output voltage, the first transistor never conducts at the same time as the second transistor conducts; each of said certain brief periods being very short in comparison with the duration of said each complete cycle.

23. The arrangement of claim 20 wherein: (i) said first periodically conducting transistor is a field-effect transistor having a pair of gate-source terminals; and (ii) a drive circuit provides a periodic drive voltage across said pair of gate-source terminals, which periodic drive voltage has a magnitude varying in a substantially sinusoidal manner during a substantial part of the complete period of the periodic drive voltage.

24. The arrangement of claim 23 wherein said substantial part is equal to at least one third of the complete period.

25. An arrangement comprising:
- a DC source operative to provide a DC supply voltage at a pair of DC supply terminals;
- a loading circuit having a pair of load terminals and including a gas discharge lamp; and
- an inverter circuit having a pair of DC input terminals connected with the DC supply terminals and a pair of AC output terminals connected with the load terminals; the inverter circuit being operative to provide an AC output voltage across the AC output terminals; the AC output voltage being characterized by: (i) consisting of sequential repetitive complete voltage cycles; (ii) alternating in polarity about a neutral potential such as to be of positive potential during about one half of the duration of each complete voltage cycle and of negative potential during the other about half of the duration of each complete cycle; (iii) having a positive peak magnitude and a negative peak magnitude, the absolute value of the positive peak magnitude being about the same as that of the negative peak magnitude; (iv) crossing over between positive and negative magnitude twice during each complete voltage cycle; (v) being of substantially sinusoidal waveform whenever its instantaneous absolute magnitude is above a minimum level, which minimum level is less than about one third of the absolute value of the positive peak magnitude; and (vi) being of non-sinusoidal waveform during at least part of each period when its instantaneous absolute magnitude is below said minimum level, which non-sinusoidal waveform is characterized by the rate-of-change of its instantaneous magnitude being substantially higher than it would be in case it be of sinusoidal waveform; the inverter circuit being further characterized by including (i) tank-inductor means, (ii) tank-capacitor means, (iii) transistors connected in circuit with the tank-inductor means and the tank-capacitor means, each transistor having transistor control terminals, and (iv) drive circuit connected with the transistor control terminals and operative to provide transistor drive voltages thereto; the drive circuit being further operative to cause each transistor to periodically alternate between being conductive and being non-conductive; the transistors being rendered conductive and non-conductive at such particular moments in time as to cause the AC output voltage to attain the above-characterized shape.

26. An arrangement comprising:
- a DC source operative to provide a DC supply voltage at a pair of DC supply terminals;
- a gas loading circuit having a pair of load terminals and a gas discharge lamp; and
- an inverter circuit having a pair of DC input terminals connected with the DC supply terminals and a pair of AC output terminals connected with the load terminals; the inverter circuit including four periodically conducting field-effect transistors inter-connected in the manner of a full-bridge inverter; the inverter circuit being functional, by way of positive feedback from the AC output terminals, to provide a substantially sinusoidal AC output voltage across the AC output terminals.

27. The arrangement of claim 26 wherein: (i) the inverter circuit is further characterized by including an L-C circuit having a tank-inductor; and (ii) periodic conduction and non-conduction of each field-effect transistor is effectuated by drive voltages derived, without incurring power dissipation, via inductive coupling from the tank-inductor.

28. An arrangement comprising:
- a DC source operative to provide a DC supply voltage at a pair of DC supply terminals;
- a loading circuit having a pair of load terminals and including a gas discharge lamp; and
- an inverter circuit having a pair of DC input terminals connected with the DC supply terminals and a pair of AC output terminals connected with the load terminals; the inverter circuit being operative to provide an AC output voltage across the AC output terminals, thereby to cause an alternating lamp current to flow through the gas discharge lamp; the inverter circuit including a group of interconnected elements connected therewithin and operative to cause the alternating lamp current to have a waveform including a substantially sinusoidal component and a substantially squarewave component; the peak magnitude of the squarewave component being substantially smaller than that of the sinusoidal component.

29. The arrangement of claim 28 wherein: (i) the squarewave component, as considered by itself, has cross-over points at which its instantaneous magnitude reverses polarity; (ii) the sinusoidal component, as considered by itself, has cross-over points at which its instantaneous magnitude reverses polarity; and (iii) the instantaneous magnitude of the squarewave component, as considered by itself, reverses polarity at points in time substantially different from the points in time at which the sinusoidal component, as considered by itself, reverses polarity.

30. The arrangement of claim 29 wherein: (i) the sinusoidal component, as considered by itself, reverses polarity at certain first points in time, approximately separated by a given duration; and (ii) the squarewave component, as considered by itself, reverses polarity at certain second points in time, also approximately separated by said given duration, with each second point in time falling approximately in the middle between adjacent first points in time.

31. An arrangement comprising:
- a DC source operative to provide a DC supply voltage at a pair of DC supply terminals;
- a loading circuit having a pair of load terminals and a gas discharge lamp; and
- an interconnected assembly of elements having a pair of DC input terminals connected with the DC supply terminals and a pair of AC output terminals connected with the load terminals; the assembly being functional to provide a substantially sinusoidal AC output voltage across the AC output terminals; the AC output voltage having a fundamental period including two half-periods; the assembly being further characterized by including at least two periodically conducting transistors series-connected between a first and a second DC terminal; the two transistors each having a terminal connected with a center junction; a substantially sinusoidal voltage existing between the center junction and one of the DC input terminals; a periodically pulsed DC voltage existing between the first and the second DC terminal.

32. The arrangement of claim 31 wherein the periodically pulsed DC voltage has an instantaneous magnitude that varies between a certain minimum level and a certain maximum level; the certain minimum level being of some magnitude distinctly higher than zero.

33. An arrangement comprising:
- a DC source operative to provide a DC supply voltage at a pair of DC supply terminals;

a loading circuit having a pair of load terminals and a gas discharge lamp; and an interconnected assembly of elements having a pair of DC input terminals connected with the DC supply terminals and a pair of AC output terminals connected with the load terminals; the assembly being further characterized by: (i) providing an AC output voltage across the AC output terminals; and (ii) including a first and a second pair of periodically conducting transistors, each pair of transistors being series-connected between a first and a second DC bus, the first pair of transistors each having a terminal connected with a first center junction, the second pair of transistors each having a terminal connected with a second center junction, a substantially sinusoidal AC voltage existing between the first and the second center junctions, a periodically pulsed DC voltage existing between the first and the second DC bus.

34. An arrangement comprising:

a DC source operative to provide a substantially constant magnitude DC supply voltage at a pair of DC supply terminals;

a loading circuit having a pair of load terminals and a gas discharge lamp; and an assembly of interconnected electronic parts having a pair of DC input terminals connected with the DC supply terminals and a pair of AC output terminals connected with the load terminals; the assembly being further characterized by: (i) including a periodically conducting transistor having a pair of transistor control terminals; (ii) a signal source connected with the control terminals and operative to provide therebetween a periodic control signal having a waveform that, over at least one third of its period, has a sinusoidal waveshape; and (iii) being functional to provide an AC output voltage across the AC output terminals.

35. The arrangement of claim 34 wherein the assembly includes circuitry functional to cause: (i) the AC output voltage to consist of a series of consecutive voltage cycles, each having a fundamental cycle period; and (ii) the periodically conducting transistor to conduct current only for a brief period once during each voltage cycle, the brief period being shorter than half the fundamental cycle period.

36. An arrangement comprising:

a DC source operative to provide a substantially constant magnitude DC supply voltage at a pair of DC supply terminals;

a loading circuit having a pair of load terminals and including a gas discharge lamp; and an assembly of interconnected electronic parts; the assembly having a pair of DC input terminals connected with the DC supply terminals and a pair of AC output terminals connected with the load terminals; the assembly being further characterized by: (i) providing an AC output voltage across the AC output terminals; and (ii) including a transistor with a pair of control terminals; (iii) sub-arrangement functional to supply a periodic control voltage at a pair of auxiliary terminals across which exists a substantially sinusoidal drive voltage; and (iv) connect means operative to provide connection between the auxiliary terminals and the control terminals, the connect means including a Zener device effectively series-connected between one of the auxiliary terminals and one of the control terminals.

37. The arrangement of claim 36 wherein the inverter circuit is further characterized by including four field-effect transistors combined such as to constitute a bridge inverter.

38. The arrangement of claim 37 wherein a resistive impedance means is connected between the gate terminal and the source terminal of at least one of the four field-effect transistors.

39. The arrangement of claim 37 wherein a Zener diode is connected in series-circuit between the gate terminal and the source terminal of at least one of the four field-effect transistors.

40. An arrangement comprising:

a DC source operative to provide a substantially constant magnitude DC supply voltage at a pair of DC supply terminals;

a loading circuit having a pair of load terminals and including a gas discharge lamp; and an assembly of interconnected electronic parts; the assembly having a pair of DC input terminals connected with the DC supply terminals and a pair of AC output terminals connected with the load terminals; the assembly being further characterized by: (i) providing an AC output voltage across the AC output terminals; (ii) including a periodically conducting transistor having a pair of integral control input terminals supplied, via an impedance means, with a first periodic voltage from a pair of auxiliary terminals across which exists a second periodic voltage derived from the AC output voltage, the first periodic voltage being of a first substantially sinusoidal waveform and having first cross-over points at which its instantaneous magnitude reverses polarity, the second periodic voltage being of a second substantially sinusoidal waveform and having second cross-over points at which its instantaneous magnitude reverses polarity, a given one of the first cross-over points occurring a brief time period after the immediately preceding one of the second cross-over points, the duration of the brief time period being substantially shorter than the duration of the fundamental period of the first periodic voltage.

41. The arrangement of claim 40 wherein a substantially sinusoidal waveform is defined a being a waveform having less than 20% of total harmonic distortion as referenced to its fundamental purely sinusoidal frequency component.

42. The arrangement of claim 40 wherein the duration of the brief time is no more than about one micro-second.

43. The arrangement of claim 40 wherein at least a substantial part of the first substantially sinsoidal waveform of delayed in time as referenced to the second substantially sinusoidal waveform.

44. The arrangement of claim 40 wherein the inverter circuit is additionally characterized by including a parallel-tuned L-C circuit having a tank-inductor across which exists a substantially sinusoidal voltage.

45. The arrangement of claim 40 wherein: (i) the periodically conducting transistor has an output terminal; (ii) a periodically pulsating unidirectional voltage exists between one of the DC input terminals and the transistor's output terminal; and (iii) the peak magnitude of the periodically pulsating unidirectional voltage, while higher than the magnitude of the DC supply voltage provided across the DC input terminals, is not more than 60% higher than the magnitude of this DC supply voltage.

46. An arrangement comprising:

a DC source operative to provide a substantially constant magnitude DC supply voltage at a pair of DC supply terminals;

a loading circuit having a pair of load terminals and a gas discharge lamp; and an assembly of interconnected electronic parts; the assembly having a pair of DC input terminals connected with the DC supply terminals and a pair of AC output terminals connected with the load terminals; the assembly being further characterized by: (i) providing a substantially sinusoidal AC output voltage across the AC output terminals; and (ii) including two periodically conducting transistors series-connected across a pair of DC bus terminals, which DC bus terminals are connected with the DC input terminals by way of a winding on a feed inductor, through which winding flows a unidirectional supply current drawn from the DC source.

47. The arrangement of claim 46 wherein the unidirectional supply current is further characterized by having an instantaneous magnitude consisting of a constant current component superimposed on which is a substantially sinusoidal current component.

48. The arrangement of claim 47 wherein the fundamental frequency of the substantially sinusoidal current component is twice as high as that of the substantially sinusoidal AC output voltage.

49. The arrangement of claim 46 wherein the assembly is further characterized by including four field-effect transistors connected together in the manner of a full-bridge inverter.

50. The arrangement of claim 46 wherein the feed inductor has a second winding; which second winding is connected between one of the DC bus terminals and one of the DC input terminals.

* * * * *